(12) United States Patent
Goktepeli et al.

(10) Patent No.: US 9,466,536 B2
(45) Date of Patent: Oct. 11, 2016

(54) SEMICONDUCTOR-ON-INSULATOR INTEGRATED CIRCUIT WITH BACK SIDE GATE

(71) Applicant: QUALCOMM Incorporated, San Diego, CA (US)

(72) Inventors: Sinan Goktepeli, San Diego, CA (US);
Stuart B. Molin, Carlsbad, CA (US);
George P. Imthurn, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/451,342

(22) Filed: Aug. 4, 2014

(65) Prior Publication Data
US 2014/0342529 A1    Nov. 20, 2014

Related U.S. Application Data

(63) Continuation-in-part of application No. 14/272,261, filed on May 7, 2014, which is a continuation of application No. 13/851,926, filed on Mar. 27, 2013, now Pat. No. 8,748,245.

(51) Int. Cl.
*H01L 21/30* (2006.01)
*H01L 21/00* (2006.01)
*H01L 21/46* (2006.01)
(Continued)

(52) U.S. Cl.
CPC ......... *H01L 21/84* (2013.01); *H01L 21/32135* (2013.01); *H01L 21/32139* (2013.01); *H01L 21/76256* (2013.01); *H01L 23/481* (2013.01); *H01L 27/1203* (2013.01); *H01L 29/78648* (2013.01); *H01L 2924/0002* (2013.01)

(58) Field of Classification Search
USPC .......... 257/774, 447, 458, 460; 438/458–460
See application file for complete search history.

(56) References Cited

U.S. PATENT DOCUMENTS 4,505,799 A    3/1985   Baxter
4,819,037 A    4/1989   Sakakibara et al.
(Continued)

FOREIGN PATENT DOCUMENTS

CN    1470073 A    1/2004
CN    1729578 A    2/2006

OTHER PUBLICATIONS

Berriah et al, Thermal Analysis of a Miniature Electronic Power Device Matched to a Silicon Wafer, NEWCAS Conference, 2010 8th IEEE International, Jun. 20-23, 2010, pp. 129-132.
Burns et al., Three-Dimensional Integrated Circuits for Low-Power, High-Bandwidth Systems on a Chip, Solid-State Circuits Conference, Feb. 2001, Digest of Technical Papers, pp. 268-276.
Chen et al., Effects of Through-BOX Vias on SOI MOSFETs, VLSI Technology, Systems and Applications, IEEE, Apr. 21-23, 2008, pp. 95-96.
(Continued)

*Primary Examiner* — Dale E Page
*Assistant Examiner* — Wilner Jean Baptiste
(74) *Attorney, Agent, or Firm* — Haynes and Boone, LLP

(57) ABSTRACT

Methods for manufacturing semiconductor-on-insulator (SOI) integrated circuits are disclosed. An SOI wafer is provided having a first surface and a second surface. The substrate of the SOI wafer forms the second surface. A transistor is formed in the semiconductor layer of the SOI wafer. A handle wafer is bonded to the first surface of the SOI wafer. The substrate layer is then removed to expose a back surface of the buried insulator of the SOI wafer. Conductive material is deposited on the SOI wafer that covers the back surface of the buried insulator. The conductive material is patterned to form a second gate electrode for the transistor on the back surface of the insulator.

21 Claims, 15 Drawing Sheets

(51) Int. Cl.
| | |
|---|---|
| H01L 21/84 | (2006.01) |
| H01L 21/762 | (2006.01) |
| H01L 21/3213 | (2006.01) |
| H01L 23/48 | (2006.01) |
| H01L 27/12 | (2006.01) |
| H01L 29/786 | (2006.01) |

(56) References Cited

U.S. PATENT DOCUMENTS

| | | | |
|---|---|---|---|
| 4,897,123 | A | 1/1990 | Mitsui |
| 4,959,697 | A | 9/1990 | Shier et al. |
| 5,122,856 | A | 6/1992 | Komiya |
| 5,198,379 | A | 3/1993 | Adan |
| 5,212,397 | A | 5/1993 | See et al. |
| 5,266,515 | A | 11/1993 | Robb et al. |
| 5,571,741 | A | 11/1996 | Leedy |
| 5,580,802 | A | 12/1996 | Mayer et al. |
| 5,593,915 | A * | 1/1997 | Ohoka .............. H01L 21/31144 148/DIG. 12 |
| 5,619,054 | A | 4/1997 | Hashimoto |
| 5,907,169 | A | 5/1999 | Hshieh et al. |
| 6,004,837 | A | 12/1999 | Gambino et al. |
| 6,060,746 | A | 5/2000 | Bertin et al. |
| 6,084,284 | A | 7/2000 | Adamic, Jr. |
| 6,130,457 | A | 10/2000 | Yu et al. |
| 6,143,582 | A | 11/2000 | Vu et al. |
| 6,153,912 | A | 11/2000 | Holst |
| 6,335,214 | B1 | 1/2002 | Fung |
| 6,337,505 | B2 | 1/2002 | Hwang et al. |
| 6,346,446 | B1 | 2/2002 | Ritenour |
| 6,515,870 | B1 | 2/2003 | Skinner et al. |
| 6,521,940 | B1 | 2/2003 | Vu et al. |
| 6,611,023 | B1 | 8/2003 | En et al. |
| 6,700,160 | B1 | 3/2004 | Merchant |
| 6,753,579 | B2 | 6/2004 | Baba |
| 6,903,918 | B1 | 6/2005 | Brennan |
| 6,927,102 | B2 | 8/2005 | Udrea et al. |
| 7,205,587 | B2 * | 4/2007 | Fujimaki ................. H01L 21/84 257/197 |
| 7,250,347 | B2 | 7/2007 | Furukawa et al. |
| 7,427,803 | B2 | 9/2008 | Chao et al. |
| 7,491,588 | B2 | 2/2009 | Campbell et al. |
| 7,525,151 | B2 | 4/2009 | Haase |
| 7,576,404 | B2 * | 8/2009 | Wilson et al. ................ 257/447 |
| 7,638,836 | B2 | 12/2009 | Walker |
| 7,651,897 | B2 | 1/2010 | Vashchenko et al. |
| 7,719,033 | B2 | 5/2010 | Jeong et al. |
| 8,030,145 | B2 | 10/2011 | Chang et al. |
| 8,072,006 | B1 | 12/2011 | Hackler et al. |
| 8,384,425 | B2 | 2/2013 | Mazure et al. |
| 8,415,743 | B2 | 4/2013 | Cai et al. |
| 8,426,888 | B2 | 4/2013 | Molin et al. |
| 8,518,758 | B2 | 8/2013 | Yang et al. |
| 8,530,287 | B2 | 9/2013 | Cai et al. |
| 8,581,349 | B1 | 11/2013 | Sekar et al. |
| 8,642,416 | B2 | 2/2014 | Or-Bach et al. |
| 8,664,712 | B2 | 3/2014 | Mazure et al. |
| 8,748,245 | B1 | 6/2014 | Stuber et al. |
| 8,928,068 | B2 | 1/2015 | Molin et al. |
| 2003/0017646 | A1 | 1/2003 | Sridharan et al. |
| 2004/0061163 | A1 | 4/2004 | Nakayama |
| 2004/0106335 | A1 * | 6/2004 | Nemoto et al. ................ 439/894 |
| 2004/0113051 | A1 | 6/2004 | Kim et al. |
| 2004/0119076 | A1 | 6/2004 | Ryu |
| 2005/0242369 | A1 | 11/2005 | Udrea et al. |
| 2005/0253175 | A1 | 11/2005 | Taddiken |
| 2006/0043436 | A1 | 3/2006 | Fan et al. |
| 2006/0068532 | A1 | 3/2006 | Schuele et al. |
| 2006/0255434 | A1 | 11/2006 | Degani et al. |
| 2007/0152269 | A1 | 7/2007 | Haase |
| 2007/0284360 | A1 | 12/2007 | Santoruvo et al. |
| 2007/0284628 | A1 | 12/2007 | Kapoor |
| 2008/0054313 | A1 * | 3/2008 | Dyer ..................... G03F 9/7084 257/276 |
| 2008/0315375 | A1 | 12/2008 | Eichelberger et al. |
| 2009/0050969 | A1 | 2/2009 | Takasu |
| 2009/0194817 | A1 | 8/2009 | Lee et al. |
| 2010/0078776 | A1 | 4/2010 | Barth et al. |
| 2010/0230735 | A1 | 9/2010 | Zhu |
| 2010/0314726 | A1 | 12/2010 | Mueller et al. |
| 2010/0315110 | A1 | 12/2010 | Fenner et al. |
| 2010/0315580 | A1 | 12/2010 | Cho et al. |
| 2011/0012199 | A1 | 1/2011 | Nygaard et al. |
| 2011/0201175 | A1 | 8/2011 | Barth et al. |
| 2011/0254092 | A1 | 10/2011 | Yang et al. |
| 2012/0088339 | A1 | 4/2012 | Molin et al. |
| 2012/0231620 | A1 | 9/2012 | Kuroda |
| 2013/0049215 | A1 | 2/2013 | Larsen |
| 2014/0291860 | A1 | 10/2014 | Stuber et al. |
| 2014/0327077 | A1 | 11/2014 | Stuber et al. |
| 2015/0137307 | A1 | 5/2015 | Stuber |

OTHER PUBLICATIONS

Chung et al., "A New SOI MOSFET Structure with Junction Type Body Contact", School of Electrical Engineering & ISRC, Electron Devices Meeting, Dec. 1999, pp. 59-62, Seaoul National University, Kwanak-Gu, Seoul Korea.

Chung, Y. et al., "SOI MOSFET Structure with a Junction-Type Body Contact for Suppression of Pass Gate Leakage", IEEE Transactions on Electron Devices, Jul. 2011, pp. 1360-1365, vol. 48, No. 7.

International Search Report dated May 11, 2012 for PCT Application PCT/US2011/055671.

Notice of Allowance and Fees dated Feb. 6, 2014 for U.S. Appl. No. 13/851,926.

Notice of Allowance and Fees Due dated Jan. 22, 2013 for U.S. Appl. No. 13/270,339.

Office Action Dated Dec. 13, 2012 for U.S. Appl. No. 13/270,335.

Office Action dated Dec. 10, 2012 for U.S. Appl. No. 13/270,339.

Office Action dated Feb. 17, 2012 for U.S. Appl. No. 13/270,339.

Office Action dated Jan. 30, 2014 for U.S. Appl. No. 13/857,136.

Office Action dated Jun. 29, 2012 for U.S. Appl. No. 13/270,339.

Office Action dated Oct. 25, 2012 for U.S. Appl. No. 13/270,339.

Qin et al., A study of nickel silicide film as a mechanical material, Sensors and Actuators A: Physical, vol. 87, Issues 1-2 Dec. 1, 2000, pp. 95-95.

Yang; Read-Preferred SRAM Cell with Write Assist Circuit Using Back-Gate ETSOI Transistors in 22-nm Technology; IEEE Transactions on Electron Devices, Oct. 2012, vol. 99, No. 10, pp. 2575-2581.

International Search Report and Written Opinion dated Aug. 4, 2014 for PCT Patent Application No. PCT/US2014/030553.

Notice of Allowance and Fees dated Sep. 4, 2014 for U.S. Appl. No. 13/857,136.

Office Action dated Dec. 31, 2014 for U.S. Appl. No. 13/860,371.

Office Action dated Jan. 8, 2015 for U.S. Appl. No. 14/272,261.

Nenadovic et al., RF Power Silicon-On-Glass VDMOSFETs, IEEE Electron Device Letters, vol. 25, No. 6, Jun. 2004, pp. 424-426.

Office Action dated Aug. 12, 2015 for U.S. Appl. No. 14/272,261.

Office Action dated Jun. 30, 2015 for Chinese Patent Application No. 201180059579.3.

Supplementary Partial European Search Report dated Jul. 31, 2015 for European Patent Application No. EP 11833222.

Notice of Allowance dated May 15, 2015 for U.S. Appl. No. 13/860,371.

Notice of Allowance for U.S. Appl. No. 14/824,491, mailed Oct. 5, 2015, 57 pages.

Baine P., et al., "Manufacturing Processes For WSi2-GPSOI Substrates and their Influence On Cross-Talk Suppression and Inductance," Semiconductor Wafer Bonding VII: Science, Technology, and Applications, Proceedings of the International Symposium, Electrochemical Society Proceedings vol. 2003-19, pp. 57-63.

* cited by examiner

- 110 Provide a semiconductor-on-insulator including an insulator layer between a semiconductor layer and a substrate layer.
- 120 Form active or reactive circuit elements in the semiconductor layer.
- 130 OPTIONAL: form a metal interconnect layer above the semiconductor layer
- 140 Couple the semiconductor layer to a handle layer
- 150 Remove the substrate layer
- 160 Form a hole that extends through the insulator layer, exposing the semiconductor layer (optional: simultaneously form a second hole that extends to the gate layer, or the interconnect layer above the semiconductor layer)
- 170 OPTIONAL: extend the hole into the semiconductor layer, exposing a layer of metal-semiconductor compound
- 180 Form a metal interconnect layer on the insulator layer and inside the holes in the insulator layer, electrically connecting two or more circuit elements to each other.

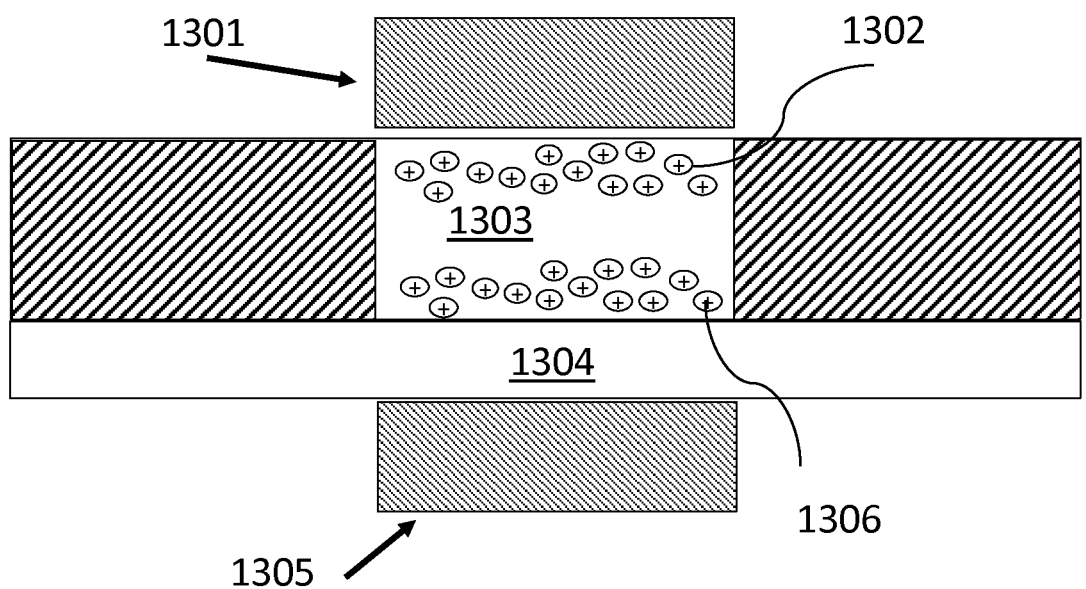

<u>1400</u>

SEMICONDUCTOR-ON-INSULATOR INTEGRATED CIRCUIT WITH BACK SIDE GATE

CROSS-REFERENCE TO RELATED APPLICATIONS

This application is a continuation-in-part of U.S. application Ser. No. 14/272,261, filed May 7, 2014, which is a continuation of U.S. application Ser. No. 13/851,926, now U.S. Pat. No. 8,748,245, filed Mar. 27, 2013, all of which are hereby incorporated by reference herein in their entirety.

BACKGROUND OF THE INVENTION

In an integrated circuit, metal lines typically connect individual circuit elements together. The nature of this metal interconnect critically affects the performance and cost of the integrated circuit product. For example, most integrated circuit processes offer multiple levels of metal interconnect, in order to allow the maximum flexibility in circuit layout. This layout flexibility allows a designer to minimize the size of an integrated circuit, for example, reducing the cost of the product.

An example of a typical circuit layout with two levels of metal interconnect is shown in FIG. 1. This layout includes two metal-oxide-semiconductor field effect transistors (MOSFET) 240. Isolation edges 235 and gate fingers 240g define the transistors. One of the transistors 240 has two gate fingers 240g and one has three gate fingers. The gate shapes 240g and isolation edges 235 determine the source and drain regions of the transistors (240s and 240d, respectively). The signal applied to the gate controls the current flowing between the source and drain regions. As shown, the gate controls the current from the top side of the channel. The drains 240d of both transistors 240 are electrically connected together, through contacts 245, first metal lines 250, inter-metal vias 270, and second metal line 280. The source regions 240s of the two transistors are connected individually through contacts 245 and first metal lines 250. The layout of FIG. 1 could be, for example, a complementary metal-oxide-semiconductor (CMOS) inverter, if one of the transistors 240 is an n-channel MOSFET and the other is a p-channel MOSFET.

In most multi-level metallization schemes, to connect upper-level metal lines to lower level metal lines or transistor electrodes (sources, drains, and gates), all of the intermediate metal layers and contacts or vias must be used. This can be seen in FIG. 1, where the second level metal line 280 is connected to transistor drains 240d through the first metal layer 250 and metal/diffusion contact 245. Thus, to connect source fingers 240s together, for example, a metal line 250 runs outside the transistor area to avoid shorting transistor sources 240s and drains 240d together. This increases the height, and thus the area, of the layout. Moreover, the width of this layout is determined by the minimum pitch of the contacted first metal lines, or the minimum pitch of the contacted source/drain regions—whichever is greater. If the minimum pitch of the contacted first metal lines is the greater of the two pitches, then this layout may be reduced in width by an alternative metallization scheme. Note that the minimum pitch of the contacted metal lines may be determined by lithographic or other process considerations, or it may be determined by electromigration concerns or other considerations/concerns.

The resistance (per unit length) and capacitance (per unit area) of the metal interconnect layers often has a direct impact on the performance of an integrated circuit. The interconnect structures and materials used affect, in turn, the resistance and capacitance of the interconnect lines. For example, the capacitance between a given interconnect line and the semiconductor substrate, or the capacitance between two interconnect lines, decreases as the vertical distance between them increases. If multiple interconnect layers are available, critical capacitances can be reduced by placing their nodes on metal layers that have more vertical separation between them.

To illustrate the origin of these parasitic capacitances, a cross-section of the layout of FIG. 1 is shown in FIG. 2. Parasitic capacitances, for example, between the gates 240g and the drain regions 240d (gate-drain capacitance) and the source 240s and drain 240d regions (off-state capacitance), are determined partly by the interconnect structure. For example, the overlap area between the first metal lines 250 and the source regions 240s forms a component of the off-state parasitic capacitance 290. The capacitance between the contact metal 245 and the transistor gates 240g contributes to the total gate-drain parasitic capacitance. Thus, the metallization scheme and layout has an effect on circuit parasitic capacitances, and therefore circuit performance.

These parasitic effects are important for high frequency and high-speed circuits. Such circuits are often implemented on semiconductor-on-insulator (SOI) technology, which was first commercialized in the late 1990s. The defining characteristic of SOI technology is that the semiconductor region in which circuitry is formed is isolated from bulk substrate by an electrically insulating layer. This insulating layer is typically silicon dioxide. The advantageous aspects of SOI technology stem directly from the ability of the insulator layer to electronically isolate the active layer from bulk substrate.

SOI technology represents an improvement over traditional bulk substrate technology because the introduction of the insulating layer isolates the active devices in an SOI structure, which improves their electrical characteristics. For example, parasitic capacitances within the semiconductor region—depletion and diffusion capacitances, for example—are often reduced in SOI devices, especially those with thin enough semiconductor layers such that the transistors are "fully-depleted." Short-channel effects—the variation of the threshold voltage of a transistor with its channel length—are also reduced in SOI devices. For these reasons, among others, SOI is often the technology of choice for high-speed, low-power circuits. In addition, the SOI's insulating layer can act to shield the active devices from harmful radiation. This is particularly important for integrated circuits that are used in space given the prevalence of harmful ionizing radiation outside the earth's atmosphere.

Like bulk-substrate technologies, SOI technologies may also make use of multiple layers of metal interconnect. If these metal layers can be formed in such a way as to take advantage of the unique structure of SOI, cost and performance benefits can result. These performance benefits may be especially desirable for the types of circuits typically fabricated on SOI technologies—high-speed or high switching frequency, low-loss circuits.

SUMMARY OF THE INVENTION

A method for manufacturing a semiconductor-on-insulator integrated circuit comprises providing a semiconductor-on-insulator wafer having a first surface and a second surface. The semiconductor-on-insulator wafer includes a semiconductor layer, a buried insulating layer, and a substrate layer. The substrate layer forms the second surface. The method also comprises forming a transistor in the semiconductor layer. Forming the transistor includes forming a first gate electrode of the transistor. The method also comprises bonding a handle wafer to the first surface of the semiconductor-on-insulator wafer. The method also comprises removing the substrate layer to expose a back surface of the buried insulator layer after bonding the handle wafer to the first surface. The method also comprises forming a hole in the back surface of the buried insulator layer that extends through the buried insulator layer and exposes the semiconductor layer. The method also comprises depositing a layer of conductive material on the semiconductor-on-insulator wafer that extends into the hole in the buried insulator layer and covers the back surface of the buried insulator layer. The method also comprises patterning the layer of conductive material to form a second gate electrode for the transistor on the back surface of the buried insulator layer. The layer of conductive material provides an electrical connection to the semiconductor layer.

Another method for manufacturing a semiconductor-on-insulator integrated circuit comprises providing a semiconductor-on-insulator wafer having a first surface and a second surface. The semiconductor-on-insulator wafer includes a semiconductor layer, a buried insulating layer, and a substrate layer. The substrate layer forms the second surface. The method also comprises forming a transistor in the semiconductor layer. Forming the transistor includes forming a first gate electrode of the transistor. The method also comprises removing the substrate layer to expose a back surface of the buried insulator layer. The method also comprises forming a hole in the back surface of the buried insulator layer that extends through the buried insulator layer and exposes the semiconductor layer. The method also comprises forming a layer of conductive material on the semiconductor-on-insulator wafer that extends into the hole in the buried insulator layer and covers the back surface of the buried insulator layer. The method also comprises patterning the layer of conductive material to form a second gate electrode for the transistor on the back surface of the buried insulator layer. The layer of conductive material provides an electrical connection to the gate electrode such that the second gate electrode and first gate electrode comprise a single circuit node in the semiconductor-on-insulator integrated circuit.

Another method for manufacturing a semiconductor-on-insulator integrated circuit comprises providing a semiconductor-on-insulator wafer having a first surface and a second surface. The semiconductor-on-insulator wafer includes a semiconductor layer, a buried insulating layer, and a substrate layer. The substrate layer forms the second surface. The method also comprises forming a transistor in the semiconductor layer. Forming the transistor includes forming a first gate electrode of the transistor. The method also comprises bonding a handle wafer to the first surface of the semiconductor-on-insulator wafer. The method also comprises removing the substrate layer to expose a back surface of the buried insulator layer after bonding the handle wafer to the first surface. The method also comprises forming a second insulator layer on the back surface of the buried insulator layer after removing the substrate. The method also comprises patterning the second insulator layer to expose the back surface of the buried insulator layer. The method also comprises depositing a layer of conductive material on the semiconductor-on-insulator wafer that covers the second insulator layer and the exposed portion of the back surface of the buried insulator layer. The method also comprises patterning the layer of conductive material to form a second gate electrode for the transistor on the back surface of the buried insulator layer.

BRIEF DESCRIPTION OF THE DRAWINGS

FIG. 3 shows a process flow chart of a method of fabricating an integrated circuit with metal interconnects on the back side of an SOI insulator that is in accordance with a specific embodiment of the present invention.

FIGS. 13A-C show cross-sections of transistor channels to illustrate the effect of a back bias voltage on the transistors in accordance with specific embodiments of the present invention.

DETAILED DESCRIPTION OF THE EMBODIMENTS

Figure 1:
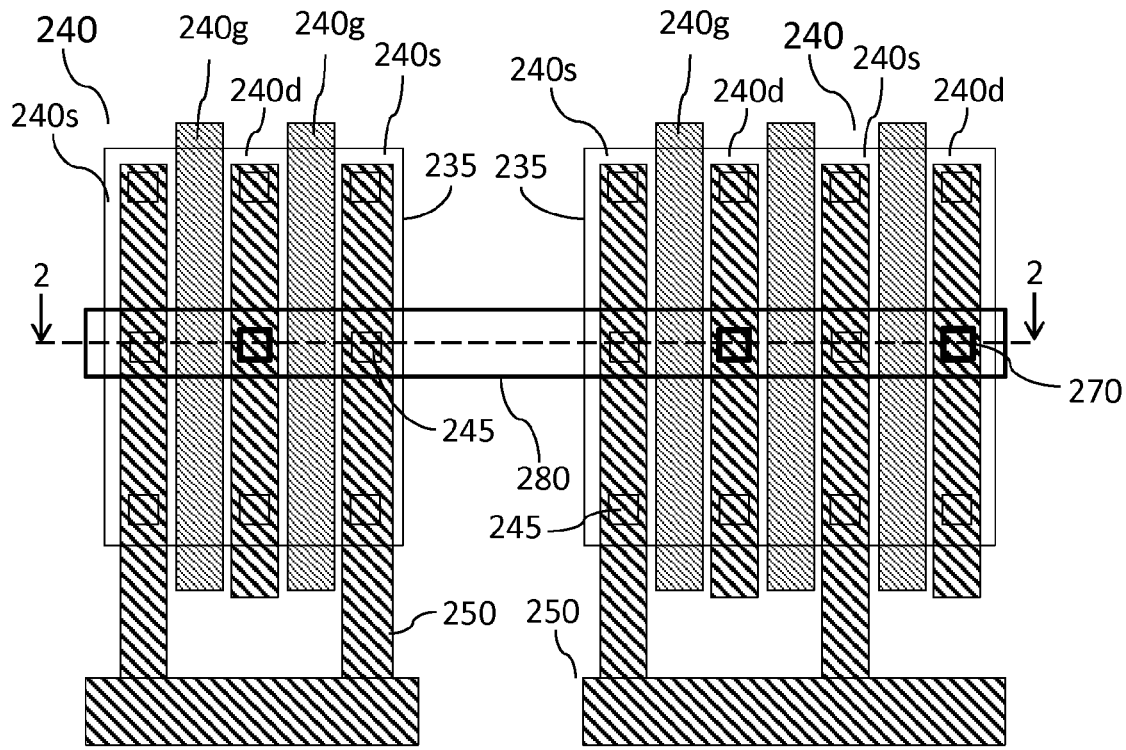
FIG. 1 illustrates a typical integrated circuit layout with two layers of metal.

High-speed, high performance integrated circuits are often fabricated using silicon-on-insulator (SOI) technologies. SOI technologies also lend themselves to layer-transfer techniques, where the active layer of the SOI is transferred, using bonding and etch-back methods, to a different substrate. This method may have advantages of lower capacitance and higher speed, easier thermal management, and easier access to the body regions of SOI transistors. An example of such a process is described in U.S. Pat. No. 8,357,935 entitled, "Silicon-on-insulator with back side connection", owned by the assignee of the present application and filed on Apr. 28, 2012, which is incorporated herein by reference in its entirety. Layer transfer techniques may also be used to form circuits on fully insulating or transparent substrates, which may be advantageous in opto-electronic applications, for example.

Transferring the active layer of an integrated circuit also can expose the surface of the insulator layer (opposite the active devices) to further processing, if desired. In particular, a full interconnect layer can be formed on this insulator layer surface after the substrate is removed. An interconnect layer so placed may contact the transistor source and drain regions through holes etched in the SOI's insulating layer. This arrangement offers added layout flexibility. Also, this back side interconnect layer provides lower parasitic capacitance when compared to traditional, front-side interconnect layers. Lastly, such an interconnect layer aids in dissipating heat generated by the SOI integrated circuit. The problems with heat dissipation on SOI circuits, and some proposed solutions, are described in U.S. Patent Publication No. 2011/0012199 entitled, "Semiconductor-on-insulator with back-side heat dissipation," owned by the assignee of the present application and filed on Jul. 14, 2010, which is incorporated herein by reference in its entirety.

In one embodiment, a full back side SOI interconnect layer connects a plurality of active or reactive devices together, providing a lower cost alternative for providing high performance SOI integrated circuits. Various embodiments include: reducing contact resistance to the back side of the active layer by forming heavily-doped regions through the back side contacts, or etching through the active layer to contact heavily doped or silicided areas on the front surface of the active layer. If the transferred structure can withstand higher temperatures, more process flexibility is possible.

FIG. 3 illustrates some embodiments of methods of the present disclosure, where a metal interconnect layer is formed on the back side of an SOI integrated circuit. In flowchart 100 of FIG. 3, a semiconductor-on-insulator structure is provided in step 110. This structure includes an insulator layer disposed between a semiconductor layer and a substrate layer. The insulator layer may be, for example, silicon dioxide, which may be 15-1000 nm thick. In step 120, active or reactive circuit elements are formed in the semiconductor layer. Such elements may include, for example, n-channel and p-channel MOS (NMOS and PMOS) transistors. The semiconductor layer may be removed in certain areas—for example, in the isolation areas located between active devices—and replaced with dielectric. These elements may be formed using, for example, a standard CMOS process, or a bi-polar-CMOS (BiCMOS) process, or a process that forms high-power devices or optoelectronic devices in addition to MOS transistors. This process may include forming a metal-semiconductor compound on regions of the semiconductor layer; for example, on the source and drain regions of the MOSFETs. Such a compound would reduce the sheet resistance of these regions. If the semiconductor layer comprises silicon, the metal-semiconductor compound may comprise, for example, titanium silicide, cobalt silicide, or nickel silicide. In step 130, a metal interconnect layer is optionally formed above the semiconductor layer. This layer may electrically connect to the circuit elements formed in the semiconductor layer. This layer may be formed using a subtractive, or Damascene, process, or it may be formed using an additive process. This layer may be comprised, for example, of a refractory metal, for example, tungsten.

In step 140 of FIG. 3, a handle layer is coupled to the semiconductor layer of the SOI structure. The handle layer could be any rigid or semi-rigid support, for example, a silicon wafer. Any suitable coupling or bonding method that results in a permanent bond may be used; for example direct or fusion bonding, permanent adhesive bonding, metallic interdiffusion or eutectic bonding. If a front-side interconnect layer is used (step 130), it may be advantageous for bonding purposes to use a Damascene process to form this layer, since a planar surface will result. A bonding layer, for example, silicon dioxide, may be deposited on the SOI structure, or the handle layer, or both. This layer may be deposited using, for example, chemical vapor deposition (CVD). In step 150, the substrate layer of the SOI is removed. This could be done by using, for example, mechanical and chemical means independently or in combination.

Still referring to FIG. 3, in step 160, a hole is etched in the exposed surface of the insulator layer. This hole extends through the insulator layer, from one surface to the opposite surface. This may be accomplished, for example, by forming the hole pattern in a photoresist using photolithography, and etching the insulator layer in an RIE or plasma etch chamber, or using hydrofluoric acid (HF). After the hole is formed, the semiconductor layer surface is exposed inside the hole. During the etching step 160, another hole that extends to a transistor gate layer, or to the (optional) interconnect layer formed in step 130, may be formed. Such a hole could be formed, for example, through the dielectric isolation areas between the active or reactive devices. All of these different types of holes—those extending to the semiconductor layer, a gate layer, or an interconnect layer—are etched through the same material (for example, silicon dioxide). Thus, they can all be etched in the same step 160. In step 170, the hole extending to the semiconductor layer may optionally be extended into the semiconductor. The etching may stop at the metal-semiconductor compound layer, if present. This etching process may be done in a dry-etch chamber, using a chemistry that will etch the semiconductor faster than the metal-semiconductor compound. For example, for a silicon layer with nickel silicide formed on the front surface, an $SF_6+O_2$ etch will etch the silicon but not etch the nickel silicide.

In step 180 of FIG. 3, a metal interconnect layer is formed on the back side of the insulator and inside the hole formed in step 160. This metal interconnect layer could comprise, for example, tungsten plugs, aluminum, copper, or a combination of these. It could be formed by standard patterning techniques; for example, depositing the metal, patterning with a photoresist, and etching the metal. The resulting pattern will connect two or more of the devices formed in the semiconductor layer to each other. If there are holes formed in step 160 that extend to a gate layer or a front-side metal interconnect layer (if step 130 is performed), then an electrical connection can be formed between the back side metal formed in step 180 and a gate or front side metal layer.

Figure 4A:
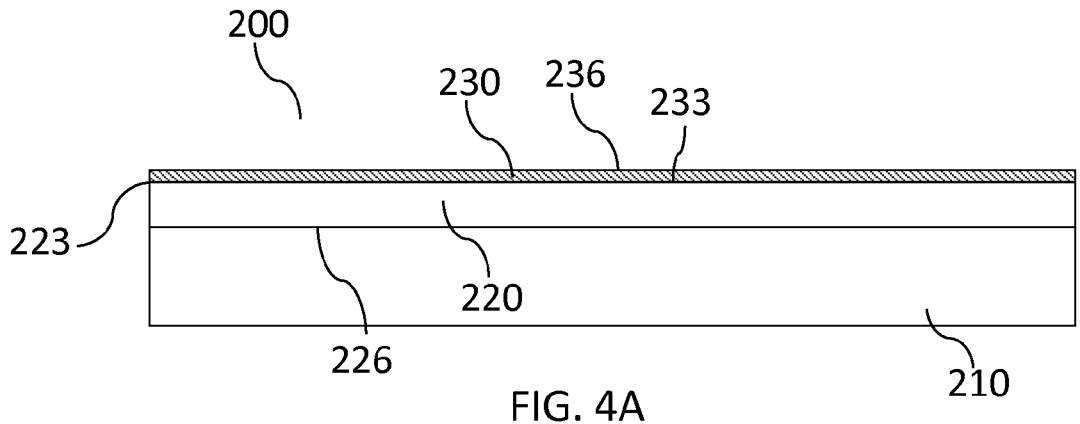
FIGS. 4A-G show cross-sectional views of stages of forming interconnect on the back side of an SOI circuit, according to some embodiments.

FIGS. 4A-G illustrate an exemplary back side SOI structure fabricated according to the method of FIG. 3. In FIG. 4A, an SOI structure 200, having a substrate layer 210, an insulating layer 220, and a semiconductor layer 230, is provided. The insulating layer 220 has a first surface 223 (in contact with the semiconductor layer 230) and a second surface 226 in contact with the substrate 210. The semiconductor layer 230 has a first surface 233 (in contact with the first surface 223 of the insulating layer 220) and a second surface 236. The insulating layer may be comprised of, for example, silicon dioxide, and it may be, for example, between 10 and 1000 nm thick, for example, between 15 and 70 nm thick, or between 150 and 350 nm thick, or between 500 and 750 nm thick. The semiconductor layer may be comprised of, for example, silicon, or a III-V semiconductor such as GaAs, or a strained semiconductor alloy such as SiGe.

Figure 4B:
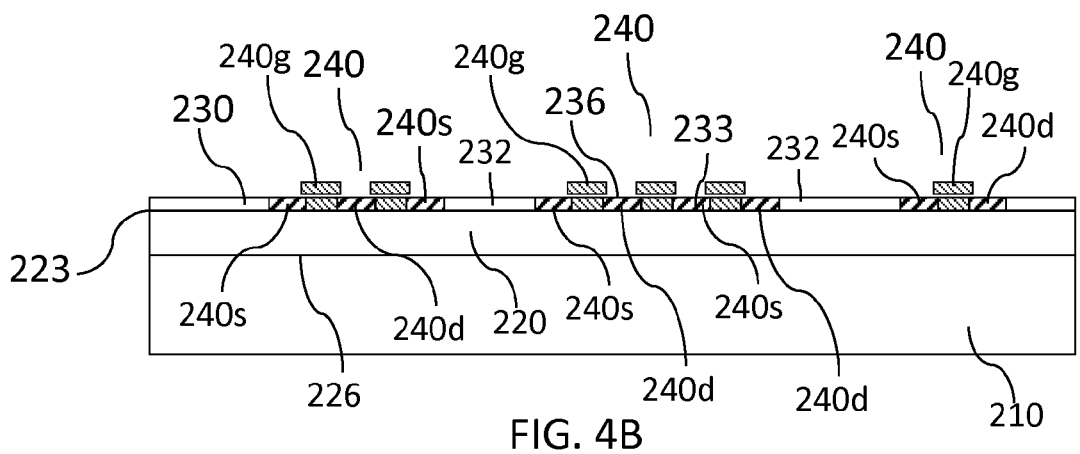

In FIG. 4B, circuit elements, for example, transistors 240, are formed in the semiconductor layer. These transistors 240 comprise source 240s and drain 240d regions, and gate layers 240g, and are separated by isolation regions 232. These elements may be formed as described for step 120 in FIG. 3 above; that is, using, for example, a standard CMOS process, or a bi-polar-CMOS (BiCMOS) process. Other circuit elements may be formed in addition to, or instead of, CMOS transistors 240, for example, high-power devices, optoelectronic devices, or other passive or reactive elements.

The source 240s and drain 240d regions in FIG. 4B comprise areas of the semiconductor layer that are heavily doped, in comparison, for example, to the transistor channel regions underneath the gates 240g. The high doping level is important, for example, to allow good electrical contact to these regions. If the semiconductor layer is thin enough—for example, less than 100 nm, or less than 70 nm, or less than 50 nm—the source and drain heavily-doped regions may extend through the full thickness of the semiconductor layer, as shown in FIG. 4B. Note also that the source 240s and drain 240d regions of transistors 240 may be raised above the surface 236 of the semiconductor layer 230. Such a structure is often used for fully-depleted SOI processes, which are built on very thin semiconductor layers, for example, less than 20 nm, or less than 10 nm, or between 5 and 7 nm.

Figure 4C:
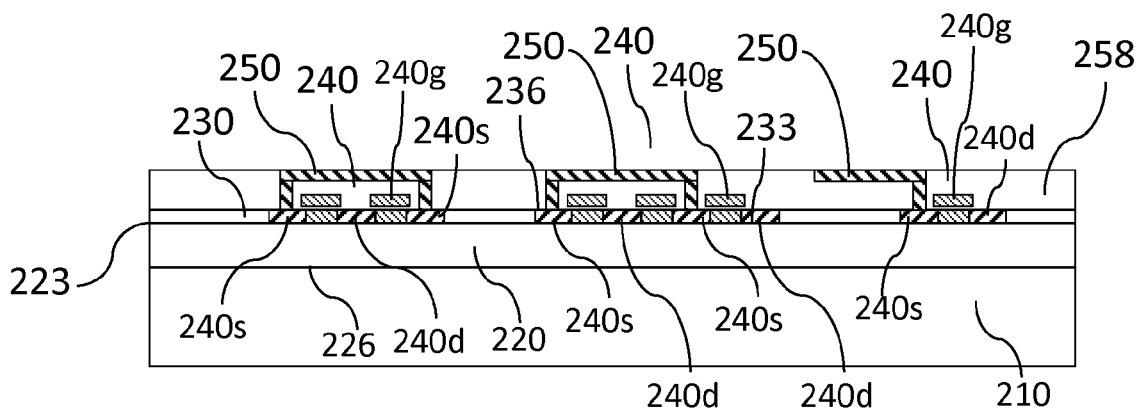
Figure 4D:
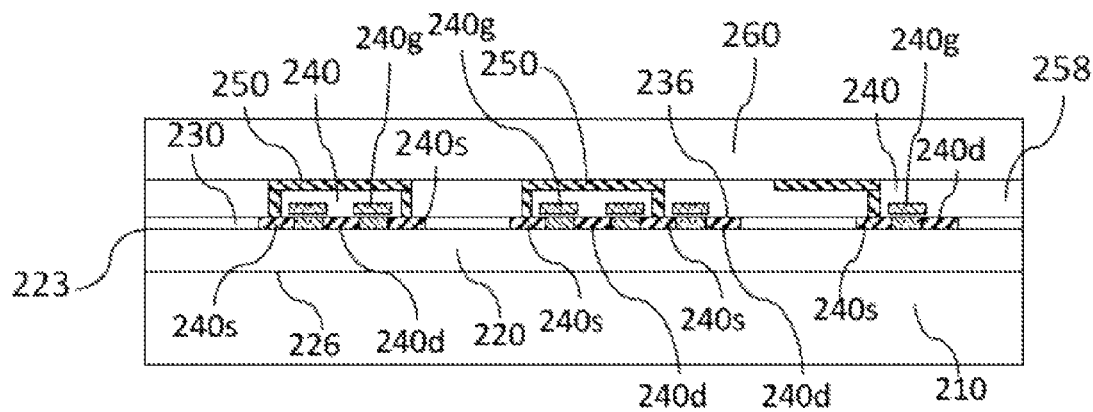

FIG. 4C shows a front metal interconnect layer 250 optionally coupled to the second surface 236 of the semiconductor layer 230, and above the circuit elements (transistors 240) fabricated therein. If present, this interconnect layer 250 may connect, for example, to the source regions 240s of the transistors 240. A subtractive, or Damascene, process may be used to form optional interconnect layer 250. Interconnect layer 250 may comprise a high-temperature capable interconnect, for example, a refractory metal, for example, tungsten. Alternatively, interconnect layer 250 may comprise a conventional low-resistivity material, for example, copper or aluminum, or it may comprise a combination of high-temperature-capable interconnect and low-resistivity material, for example tungsten plugs with aluminum or copper metal. An inter-level dielectric layer 258 separates the optional front metal interconnect layer 250 from the devices 240 formed in the semiconductor layer 230. In FIG. 4D, a handle layer 260 is coupled to the surface 236 of the semiconductor layer 230, with inter-level dielectric layer 258 and front interconnect layer 250, if present, intervening. As shown in FIG. 4D, handle layer 260 is bonded above interconnect layer 250, if present. As described in step 140 of FIG. 3, the handle layer could be any rigid or semi-rigid support, for example, a silicon wafer, and any suitable coupling or bonding method that results in a permanent bond may be used; for example direct or fusion bonding, or permanent adhesive bonding. A bonding layer (not shown), for example, deposited silicon dioxide, may be formed on the either, or both, of the bonded surfaces.

Figure 4E:
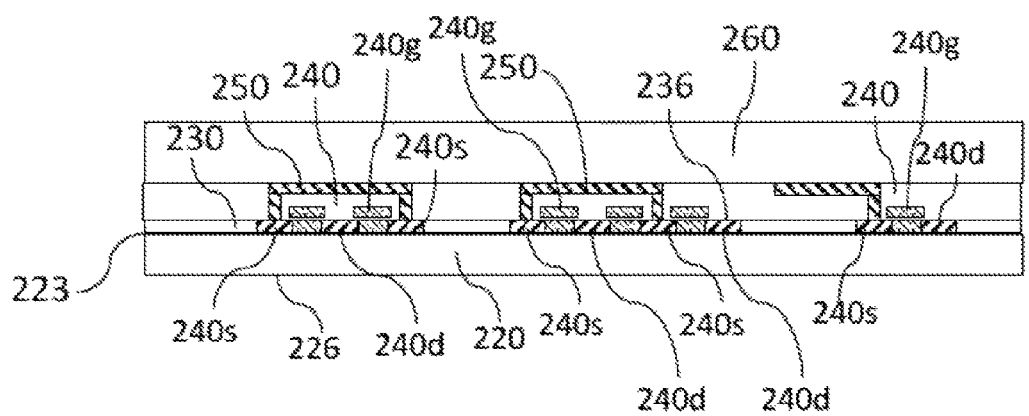
Figure 4F:
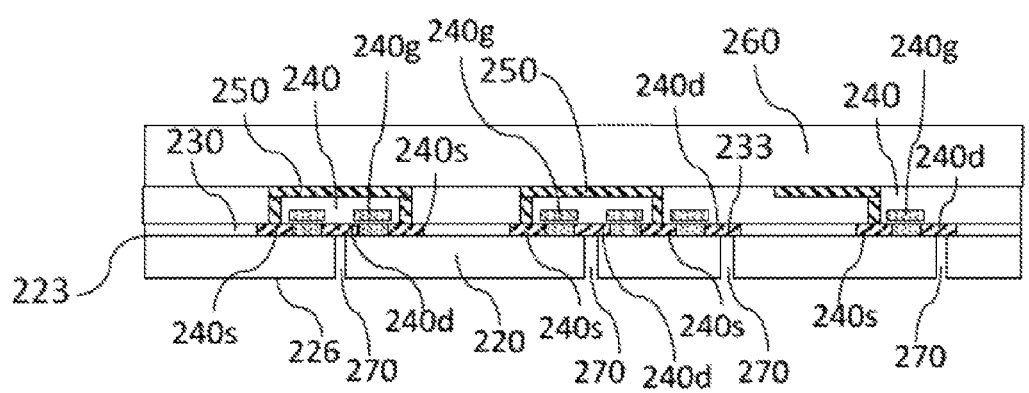

In FIG. 4E, the substrate 210 of the SOI structure has been removed, by using, for example, mechanical and chemical means independently or in combination. This step exposes the surface 226 of the insulator layer 220. In FIG. 4F, holes 270 have been etched through the insulator layer 220, exposing regions of the surface 233 of the semiconductor layer 230. These holes can be formed by any standard patterning technique as described above for step 160 in FIG. 3, for example, photolithographic patterning of a resist layer followed by dry etching of the insulator layer 220. These holes may expose, for example, the drain regions 240d of transistors 240. Holes could also expose, for example, source or body regions of CMOS transistors, or collector regions of vertical bipolar transistors, or collector, base, or emitter regions of lateral bipolar transistors.

Figure 4G:
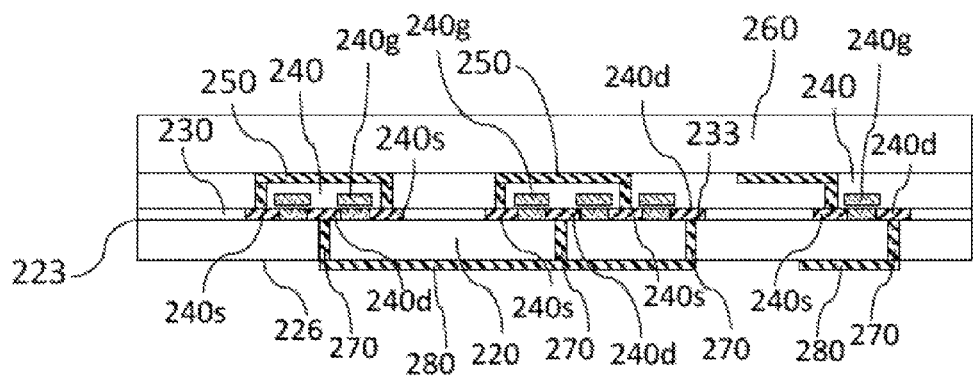

Turning to FIG. 4G, a back side metal interconnect layer 280 is formed on the surface 226 of insulator layer 220 and inside the holes 270. As described in step 170 of FIG. 3, this metal interconnect layer could comprise, for example, aluminum, copper, tungsten, or a combination of these. It could be formed by standard patterning techniques; for example, an additive process, or a subtractive process. The back side metal layer 280 may connect two or more transistors 240 to each other. For example, as shown in FIG. 4G, back side metal layer 280 may connect some of the drains 240d of transistors 240 together.

Figure 5:
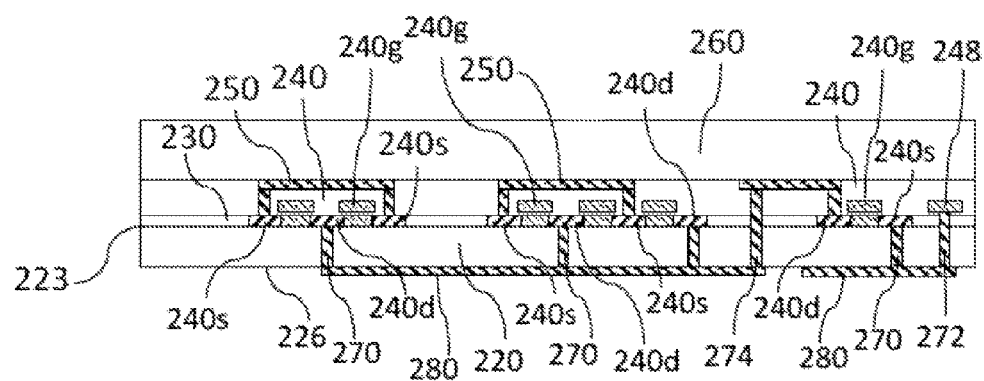
FIG. 5 shows a cross-sectional view of another embodiment, wherein multiple types of back contacts are formed.

FIG. 5 shows an alternative structure that may be formed using the process according to the method of FIG. 3. In FIG. 5, other holes 272 and 274 are formed, in addition to holes 270. Both holes 272 and 274 are formed over isolation regions between transistors 240. Hole 272 extends to a gate region 248 that extends over the isolation region, and hole 274 extends to the optional front metal interconnect layer 250. Holes 272 and 274 may be formed simultaneously with holes 270; that is, in the same masking step. Alternatively, separate masking steps may be used for the different types of contact holes, for example, if it is desired that the overetch of the semiconductor layer inside holes 270 be minimized. In this structure, the back side interconnect is electrically connected to the optional front side interconnect, or the transistor gate layer, or both. This can allow greater layout flexibility and thus cost savings.

Figure 6:
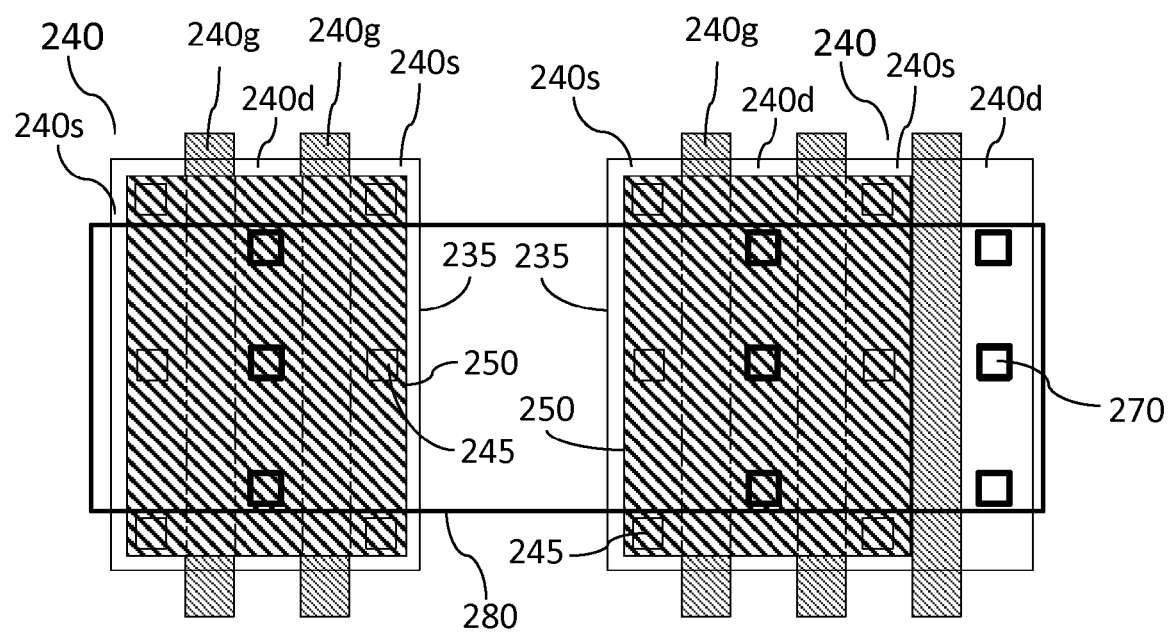
FIG. 6 shows a layout of an SOI integrated circuit using back side interconnect that is in accordance with a specific embodiment of the present invention.

FIG. 6 shows an example layout that utilizes the area-saving features of this invention. As in FIG. 2, gate fingers 240g and isolation edges 235 define transistors 240. Transistors 240 further comprise drain regions 240d and source regions 240s. A front side metal interconnect layer 250 connects the source regions 240s together through contacts 245. Note that there is no connection between interconnect layer 250 and the drain regions 240d; therefore, the metal layer 250 connecting the source regions 240s can be drawn overlapping the drain regions 240d without going outside of the transistor area. Drain regions 240d are connected through back side holes (or vias) 270 to back side interconnect layer 280. In this way, the area of this integrated circuit can be reduced compared to the prior art shown in FIG. 2.

Figure 7A:
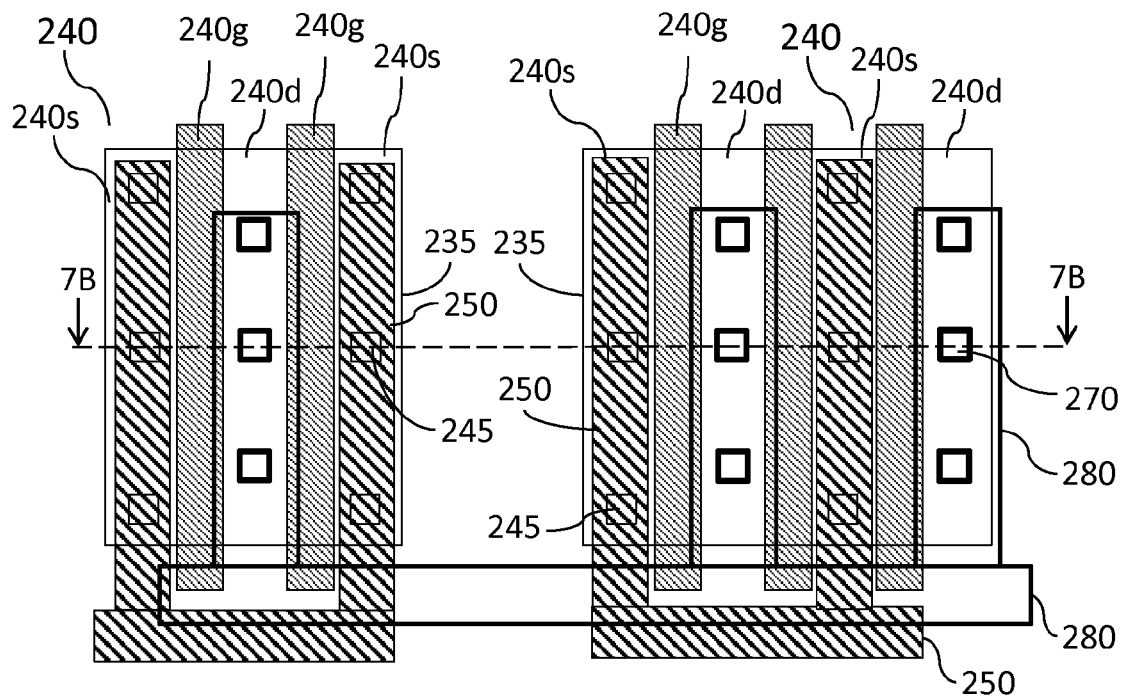
FIGS. 7A-B show an alternative layout and cross section of an SOI integrated circuit using back side interconnect that is in accordance with a specific embodiment of the present invention.
Figure 7B:
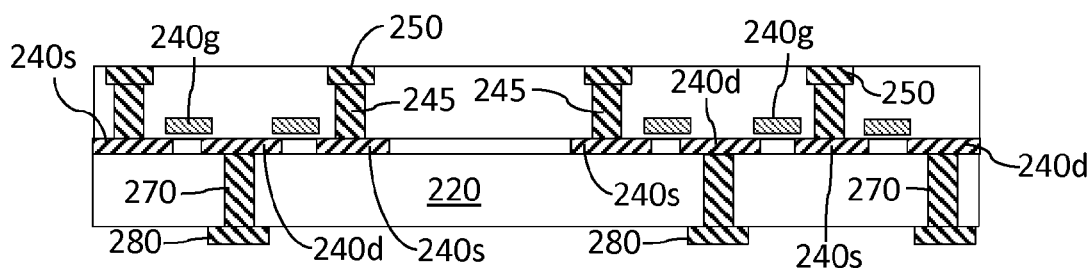

FIG. 7A shows an example layout for the reduction of parasitic capacitance. Again, gate fingers 240g and isolation edges 235 define the source 240s and drain 240d regions of transistors 240. Front side metal 250 is again connected to the source regions 240s through contacts 245. Back side metal 280 is connected to drain regions 240d through back side vias 270. So as to reduce drain-to-source (off-state) capacitance, the source metal 250 is not drawn overlapping the drain regions 240d, and the back side drain metal 280 is not drawn overlapping the source regions 240s. Thus, the interconnect contribution to the parasitic off-state capacitance is limited to the area of overlap of the back side metal 280 and front side metal 250 layers. However, this capacitance is much reduced compared to the case of FIG. 2, since the two layers are more separated vertically. FIG. 7B shows a cross sectional view of the layout illustrated in FIG. 7A. This figure clearly shows how the front side source metal 250 and the back side drain metal 280 are separated from each other as far as they can be.

Figure 8:
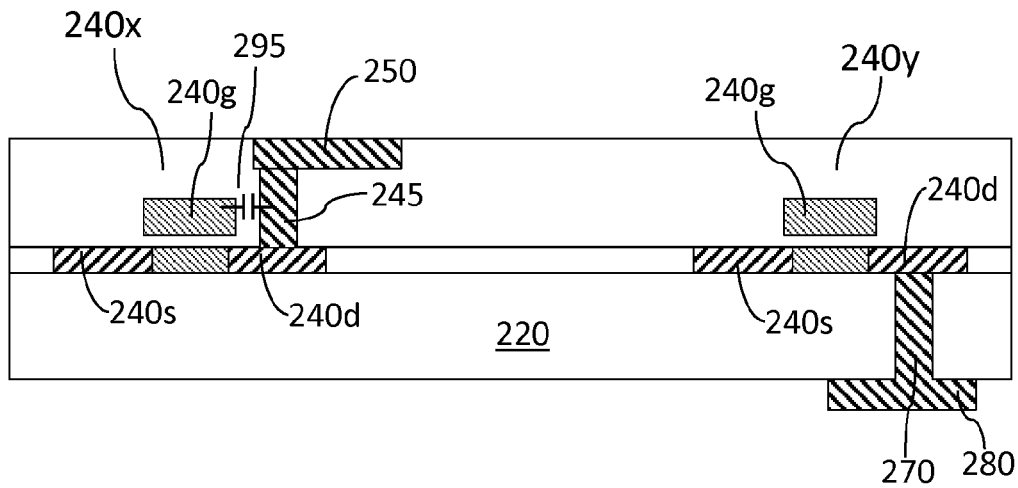
FIG. 8 shows a cross-sectional view of transistors formed using an embodiment of the current invention, illustrating differences in parasitic capacitances.

Using this embodiment, where the back side metal 280 connects to drain regions 240d, the gate-to-drain capacitance is also reduced. FIG. 8 shows a cross section of two transistors 240x and 240y fabricated using an embodiment of the current invention. Transistor 240x has its drain 240d contacted from the front, and transistor 240y has its drain 240d contacted from the back. The gate-drain capacitance for transistor 240x includes as a component the capacitance 295 between the front contact 245 and the gate 240g. However, for the back-contacted transistor 240y, there is no such capacitance adding to the total gate-drain capacitance. Thus, the total gate-drain capacitance is reduced for transistors with back-contacted drains.

Figure 2:
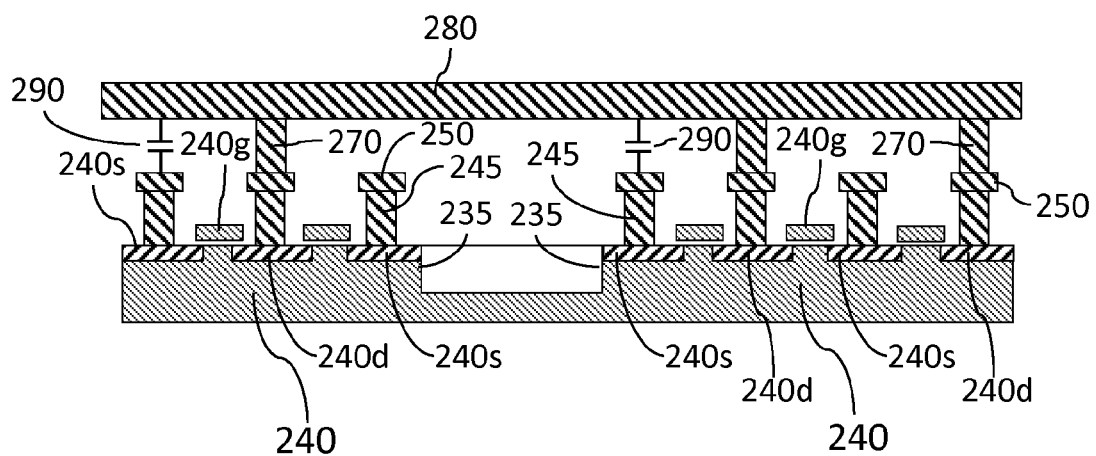
FIG. 2 illustrates a cross-section of the circuit layout shown in FIG. 1.

Note also that, in the transistor layouts (FIG. 6 and FIG. 7), the transistors 240 may be more compacted in the direction perpendicular to the gate fingers 240g, compared to layouts using standard processes (e.g., FIG. 2). This is the case if the minimum front-side contacted metal pitch is greater than the minimum contacted transistor source/drain pitch, which would make the layout of FIG. 2 metal-pitch limited. As shown in FIGS. 6 and 7, the number of front side metal pitches needed to contact the sources and drains of the transistors 240 is reduced by about a factor of 2.

Figure 9A:
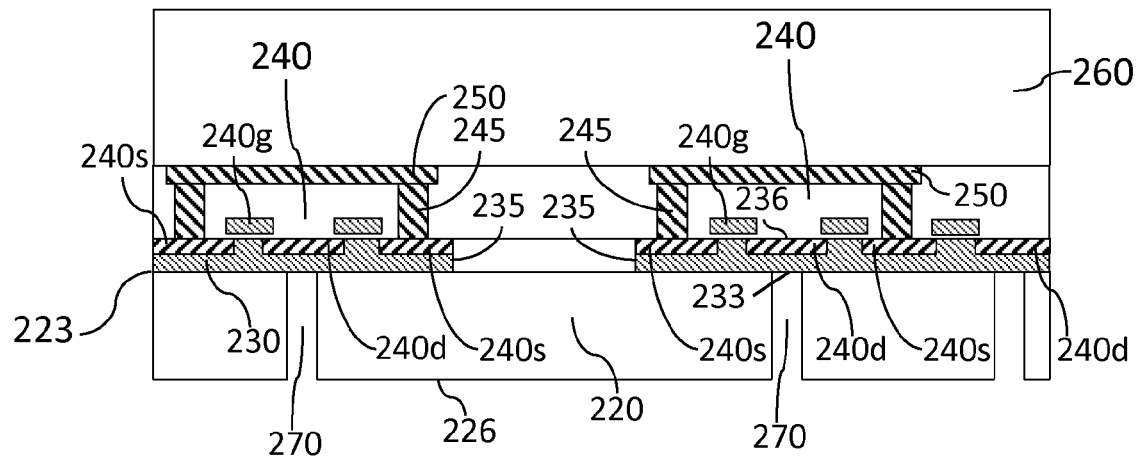
FIGS. 9A-C show cross-sectional views of stages of forming back side diffusions and interconnect, according to some embodiments.
Figure 9B:
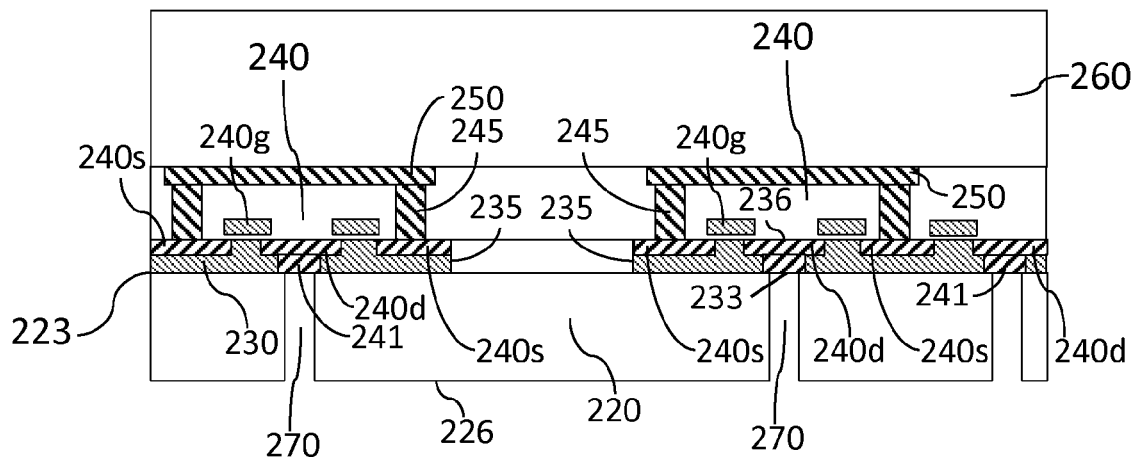
Figure 9C:
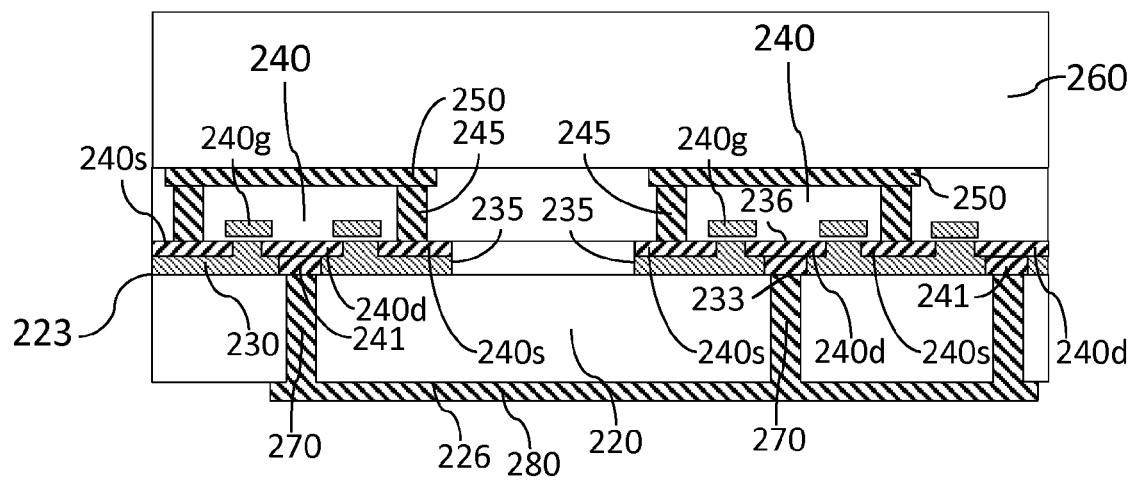

FIGS. 9A-C illustrate an alternative embodiment of an SOI back side metal interconnect. FIG. 9A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Holes 270 have been etched in insulator layer 220 to expose surface 233 of semiconductor layer 230. In FIG. 9B, dopant has been introduced inside holes 270 to form doped regions 241, of the same dopant type as drain regions 240d. Regions 241 effectively extend drain regions 240d to the back surface 233 of semiconductor layer 230, and allow the drain regions 240d to be contacted through back side holes 270. Doped regions 241 may be formed by, for example, implanting dopant ions through holes 270, as described in U.S. Patent Publication No. 2012/0088339 A1 entitled, "Vertical Semiconductor Device with Thinned Substrate," owned by the assignee of the present application and filed on Oct. 11, 2011, which is incorporated herein by reference in its entirety. Alternatively, doped regions 241 may be formed by exposing the structure to a dopant-species-containing ambient (for example, POCl$_3$) at a high temperature (for example, greater than 800° C.). If ion implantation is used, it may be followed by an annealing process to activate the dopant, for example, a rapid thermal anneal at a temperature of 800 to 1000° C. for 1 to 60 seconds. Note that, if a high temperature process is used for this step, it would be advantageous to use a high temperature metal for the front side metal interconnect layer 250, if this layer is used. For example, it would be advantageous if a refractory metal, for example, tungsten, were used for front side metal interconnect 250.

In FIG. 9C, a back side metal interconnect layer 280 is formed on the surface 226 of insulator layer 220 and inside the holes 270, contacting doped region 241 connected to drain regions 240d. This metal interconnect layer could comprise, for example, tungsten, aluminum, copper, or a combination of these. This interconnect layer may, as shown in FIG. 9C connect the drains 240d of transistors 240 together, through back side vias 270 and doped regions 241.

The process described in FIGS. 9A-B provide a means of forming a back-side interconnect contacting drain or source regions, when these regions do not extend to the back side of the semiconductor layer. This may be the case, for example, if the semiconductor layer is greater than 200 nm thick, or greater than 100 nm thick, or greater than 70 nm thick.

Figure 10A:
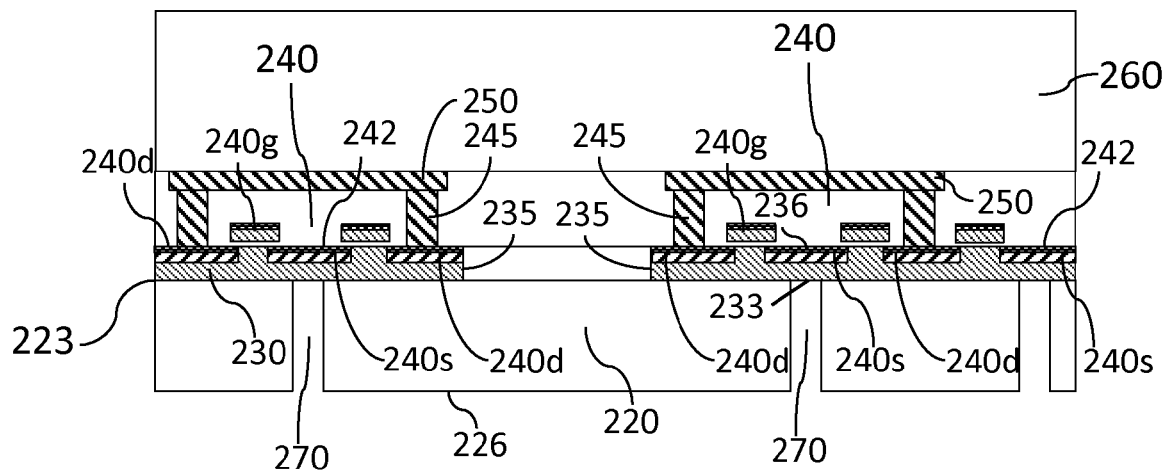
FIGS. 10A-C show cross-sectional views of stages of forming back side contacts and interconnect, according to some embodiments.
Figure 10B:
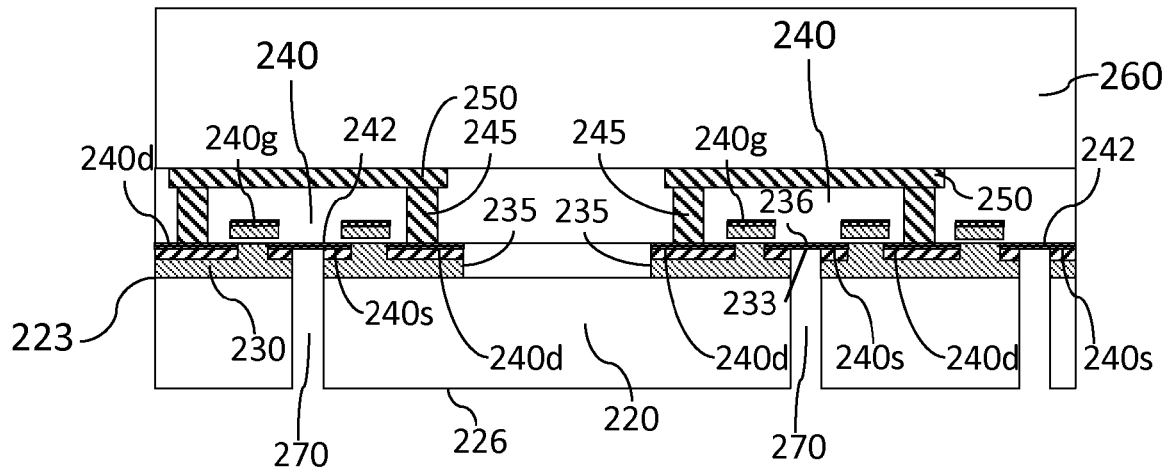
Figure 10C:
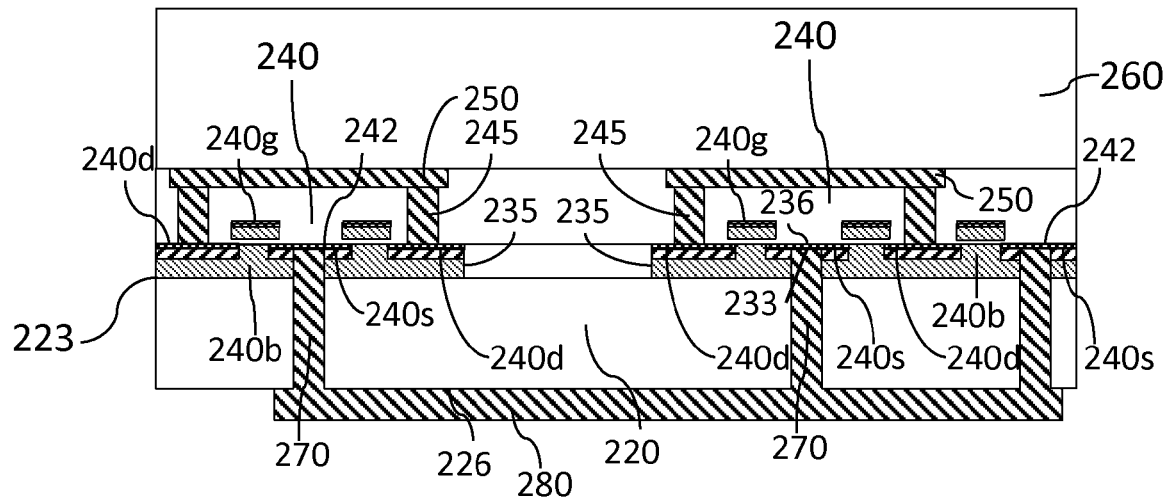

FIGS. 10A-C illustrate another alternative embodiment of an SOI back side metal interconnect. FIG. 10A shows an SOI integrated circuit, with transistors 240 and front-side interconnect layer 250, bonded to handle layer 260. Heavily doped source regions 240s and drain regions 240d do not extend through to the back surface 233 of semiconductor layer 230. Moreover, regions of a metal-semiconductor compound 242 have been formed on the surfaces of the drain regions 240d, source regions 240s, and gate regions 240g of transistors 240. These metal-semiconductor compounds are often used to reduce the sheet resistance and contact resistance of these regions. If the semiconductor layer comprises silicon, the metal-semiconductor compound may comprise, for example, titanium silicide, cobalt silicide, or nickel silicide. These regions are often referred to as "self-aligned silicide", or "SAlicide", regions.

Still referring to FIG. 10A, holes 270 have been etched in insulator layer 220 to expose surface 233 of semiconductor layer 230. In FIG. 10B, the holes 270 have been extended into the semiconductor layer 230 to contact the back side of the metal-semiconductor compound regions 242. This etching process may be done in a dry-etch chamber, using a chemistry that will etch the semiconductor faster than the metal-semiconductor compound. For example, for a silicon layer with nickel silicide formed on the front surface, an SF$_6$+O$_2$ etch will etch the silicon but not etch the nickel silicide. In FIG. 10C, a back side metal interconnect layer 280 is formed on the surface 226 of insulator layer 220 and inside the holes 270, contacting metal-semiconductor compound regions 242 electrically connected to source regions 240s. This metal interconnect layer could comprise, for example, tungsten, aluminum, copper, or a combination of these.

The structure of FIG. 10C offers several advantages. For example, the transferred semiconductor layer 230 does not need to be exposed to high temperature steps (e.g., to activate dopants), so that low-resistivity, low-temperature metals (e.g., aluminum or copper) may be used for the front-side metal interconnect layer, if present. Also, the hole 270 filled with interconnect metal 280 contacting the metal-semiconductor compound region 242 together provide an excellent thermal path for efficient transfer of heat from active devices 240. Finally, the contact resistance between the metal-filled hole 270 and the metal-semiconductor compound 242 may be advantageously lower than the metal-semiconductor contact resistance between metal-filled holes 270 and the silicon surface 233 (FIG. 4G and FIG. 9C).

In FIG. 10C, the back side interconnect layer 280 is shown connecting transistor sources 240s rather than transistor drains 240d. In this structure as shown, there may be some conduction between the metal filling the hole 270 and the body region 240b of the transistor 240. Thus, in FIG. 10C, the sources and body regions of transistors 240 may be effectively shorted together. For many circuits, especially digital circuits, this is desired. For these types of circuits, then, this structure may offer a layout advantage, since a separate body contact is not necessary.

The process described in FIGS. 10A-C may also be used in combination with the process wherein the diffused regions reach the back side of the semiconductor layer 230 (FIGS. 4A-G). This may be advantageous, for example, in cases a lower drain contact resistance is desired. This structure is also less susceptible to unintended conduction between the metal filling the holes 270 and the body regions of transistors 240, so, for example, analog or other circuits, where source-body ties are not necessarily desired, may be implemented.

The process described in FIG. 3 can be modified to decrease the on resistance of the transistor channels in the semiconductor layer while at the same time keeping the break down voltage of the transistors high. These characteristics are important for transistors generally, and are particularly important for RF transistors in that they are expected to hold off large voltages in their off state and carry large currents in their on state. The process shown in FIG. 11 allows for the formation of a second gate electrode for a transistor in the semiconductor layer. The second gate electrode is formed on the back side of the SOI wafer and applies a beneficial bias to the channel of the transistor. In some approaches, the second gate electrode can create a channel for the transistor. The second gate electrode can be a strip of conductive material that is aligned to the channel of the transistor under the buried insulator layer. In specific approaches, the second gate electrode will allow the transistor to exhibit two channels which essentially doubles the conductivity of the transistor while keeping the breakdown of the transistor voltage constant for a given transistor width. The process shown in FIG. 11 shares many of the features of the process in FIG. 3, and all the variants of FIG. 3 discussed above can be applied to or can be applied in combination with the process shown in FIG. 11.

Variants of process 1100 shown in FIG. 11 can be described with reference to FIGS. 12A-C. Process 1100 is a method for manufacturing a SOI integrated circuit. The process begins with step 110 which is described above, and involves providing an SOI wafer with a first surface and a second surface. The second surface is formed by the substrate layer of the wafer. Process 1100 proceeds with step 1110 in which a transistor, such as transistor 240, is formed in the semiconductor layer of the SOI wafer. The transistor includes a first gate electrode 240g that controls the current flowing between the source and drain of the transistor. Process 1100 then proceeds with step 1120 in which a handle wafer, such as handle wafer 1202, is bonded to the SOI wafer 1201. The handle is attached to the first surface of the wafer. The bonding can be done using any of the techniques described above with reference to the process of FIG. 3. Process 1100 proceeds with step 105 in which the substrate is removed. This step can be conducted using any of the techniques described above with reference to the process of FIG. 3 such as applying a chemical etchant or chemical mechanical grinding process to the second surface of the substrate. This removal process exposes a back surface of the buried insulator layer.

After step 150 has been conducted, process 1100 proceeds with step 1130 in which a layer of material is deposited that covers the now exposed back surface of the buried insulator layer. The layer of material can then be patterned as in step 1140 of process 1100. The material can be a conductive material such as a refractory metal (e.g., tungsten, tungsten silicide, or molybdenum), other metals (e.g., aluminum, copper, or aluminum alloys), doped polysilicon, or any highly doped semiconductor. The patterning can create strips of the material that are aligned with the gates of the transistors in the active layer. Steps 1130 and 1140 can be conducted simultaneous with the use of a mask such that the conductive material is formed in a pattern set by the mask. However, steps 1130 and 1140 can also involve a blanket deposition of the material and a separate etching step to form the pattern.

The patterned layer of material will form a second gate electrode for the transistor on the back surface of the insulator layer. Depending upon the thickness of the buried insulator layer, the second gate electrode may only provide a bias to the body to improve the performance of the device. In the alternative, if the buried insulator is thin enough, the second gate electrode can create a second channel in the body of the transistor which will effectively double the conductivity of the channel. The pattern will generally form strips of material below the original gate electrodes of the transistors in the semiconductor region.

In specific implementations of process 1100, the layer of material is formed on the back surface of the buried insulator layer, which is the same surface that was exposed when the substrate was removed. In other words, there is no need to additionally etch the buried insulator layer because the buried insulator layer is thin enough to allow a second electrode to affect the channel in the desired fashion. As a specific example, the buried insulator can be less than 400 nanometers thick when the material is deposited in step 1130. The desired gate pattern is formed by patterning the material itself as in step 1140 or by depositing and patterning a second insulator layer as described below with reference to process 1400. These approaches are beneficial from a cost perspective because they do not require a patterning step for the buried insulator layer. In addition, these approaches provide the additional benefit of avoiding damage or pressure to the buried insulator layer in proximity to the channels of the transistors. This is important because it is at this point in the semiconductor layer where the quality of the buried insulator has the greatest effect on the performance of the overall integrated circuit. To the same end, it is beneficial to use a process for removing the substrate that is highly selective to the buried insulator. As a specific example, the buried insulator layer has a first thickness after step 110 that is less than 400 nanometers and after step 150 the buried insulator has a second thickness that is less than 50 nanometers smaller than the first thickness.

Figure 12A:
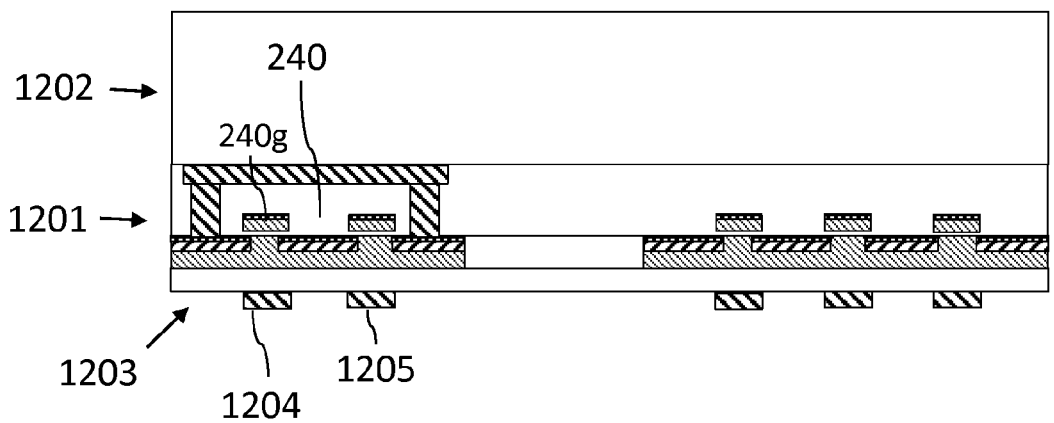
FIGS. 12A-C show cross-sections of semiconductor-on-insulator integrated circuits with gate electrodes on the back side of the buried insulator layer in accordance with specific embodiments of the present invention.

FIG. 12A provides an example of the deposited material after it has been patterned. The illustrated cross section crosses through strips of material that are aligned with the transistor gates such as gate 240g. The strips of material extend into and out of the illustrated cross section and may cover the entire width of the gate. Outside the plane of the page, the strip of material will be contacted such that a bias voltage can be applied to the strip of material. Strips of material that underlay gate fingers of a single transistor, such as strips 1204 and 1205, can be tied together to receive a common bias voltage. The strips of material can receive a bias voltage from an external contact. For example, a bond wire or solder bump that is physically connected to the strips can supply an external voltage to bias the transistors bodies as desired.

Figure 12B:
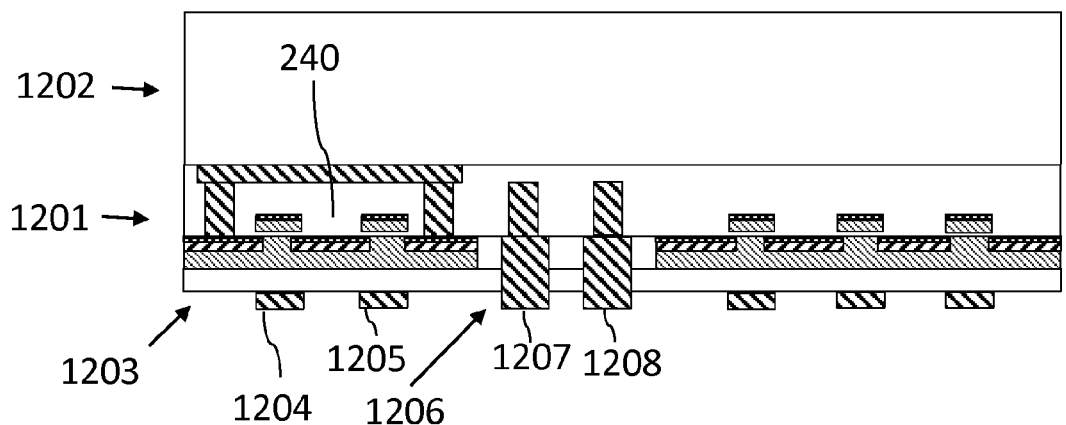
Figure 12:
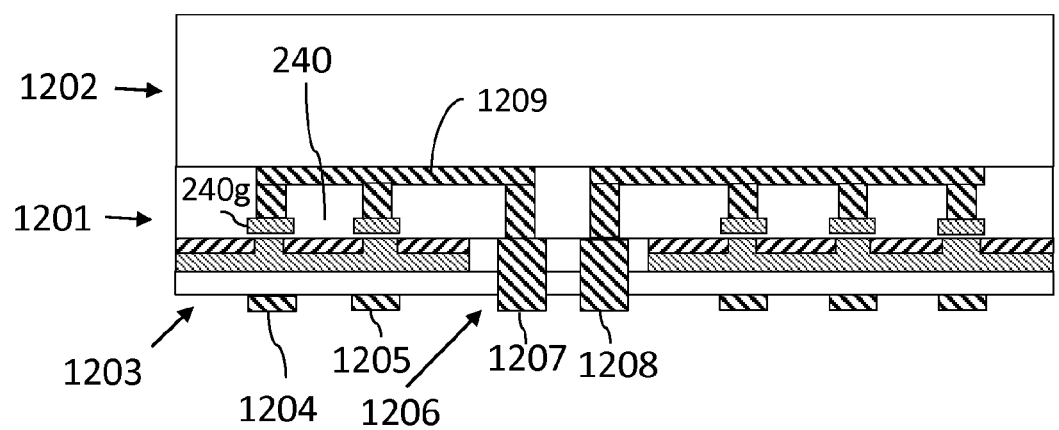

FIG. 12B provides another example of the deposited material after it has been patterned. In this example, an optional step 160 of process 1100 has been executed to form a hole 1206 in the buried insulator layer. Step 160 can be conducted in any of the ways described above with reference to FIGS. 3 and 4F. The hole in the back surface of the buried insulator layer 1260, formed in step 160, extends through the insulator layer and exposes the semiconductor layer. When this optional step is conducted, the layer of material that is deposited in step 1130 will not only cover the back side of the buried insulating layer 1203, but it will also extend into the holes formed in step 160 such as hole 1206. Step 160 can be used in combination with another optional step in which a contact for the layer of material is formed on or in the semiconductor layer. This contact can be formed after step 1110. In specific approaches, the layer of material will be a metal silicide that is formed when the gate, source, and drain are exposed to a silicidation step. In an alternative approach, the exposed semiconductor layer can be exposed to a silicidation step from the back side after the hole is formed, or some other kind of contact can be formed from the back side. As another example, the exposed semiconductor layer could be heavily doped from the front side or from the back to form a contact for the deposited layer. In all of these approaches, the layer of material provides an electrical connection to the semiconductor layer.

One of the benefits of providing a hole in the insulator layer is that the strips of material below the buried insulator layer can be biased via an internal bias voltage in the integrated circuit. As mentioned above, these strips of material can be referred to as the second gate electrodes of the transistors. Although the cross section of FIG. 12B does not show a connection between gate strips 1204 and 1205 and the portion of the deposited material 1207 that extended into hole 1206, this is because the strips of material do not extend laterally in the area below the source and drain areas because in some instances this can detrimentally affect the performance of the device. However, the strips of material in FIG. 12B are ultimately connected to 1207 and 1208. The strips on the left side of FIG. 12B will extend out of and into the page and contact 1207 outside the plane of the page using a lateral strip of the patterned material that will underlie either a break in the source and drain region or be completely outside of the width of the transistor. In some approaches, the lateral strip could be completely outside the isolation barrier for the transistor. Likewise, the strips on the right side of FIG. 12B will be connected to contact 1208 in a similar fashion. As such, the second gate electrode for different transistors can be independently biased via an internal bias voltage so long as each electrode is associated with a separate hole through the buried insulator layer. The internal voltage applied to the second gate electrodes can be generated in the integrated circuit using a charge pump, a band gap circuit, or any internally regulated power supply voltage that was supplied to the integrated circuit and then routed to the contacts via the internal wiring of the integrated circuit.

FIG. 12C provides another example of the deposited material after it has been patterned. FIG. 12C shows metallization 1209 which provides an electrical connection to the first gate electrodes of the transistors in the semiconductor layer. Metallization 1209 can be formed in a similar fashion to the manner in which the metal lines 250 where formed for the first interconnect layer in step 130 of FIG. 3. Metallization 1209 also provides an electrical connection to the portion of the deposited material 1207 that extended into hole 1206. As described previously, the regions of deposited material that extend into these holes will be electrically connected to the strips of material that underlie the gates of the transistors under the buried insulator layer to form second gate electrodes such as 1204 and 1205. As a result, the same voltage can be used to simultaneously bias both the first and second gate electrodes of a transistor using metallization 1209 and the portion of the deposited material 1207 that extended into hole 1206. In this kind of configuration, the layer of material provides an electrical connection to the first gate electrode such that the second gate electrode and first gate electrode comprise a single circuit node in the SOI integrated circuit.

As shown in FIGS. 12B-C, in certain approaches, hole 1206 is created outside the lateral extent of the isolation edges of the semiconductor layer. The benefit of these approaches again relates to the fact that disturbing the buried insulator layer in proximity to the channels of the transistors in the integrated circuit can detrimentally alter the performance of the transistors. It is therefore beneficial to create some distance between where the hole in the buried insulator is created and where the transistor channels lie on the device. In particular, this benefit is achieved when the hole is formed outside of the isolation edges of the critical transistors in the integrated circuit.

Figure 13A:
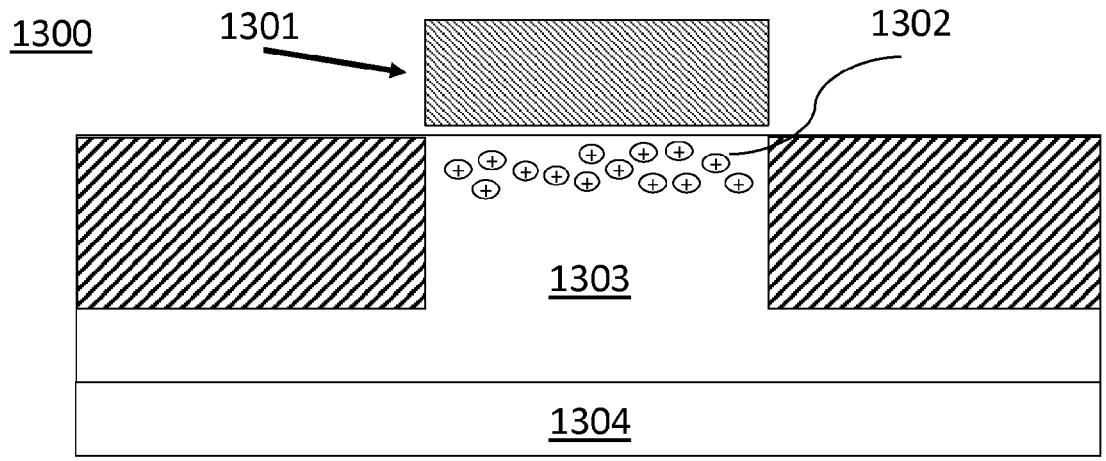
Figure 13B:
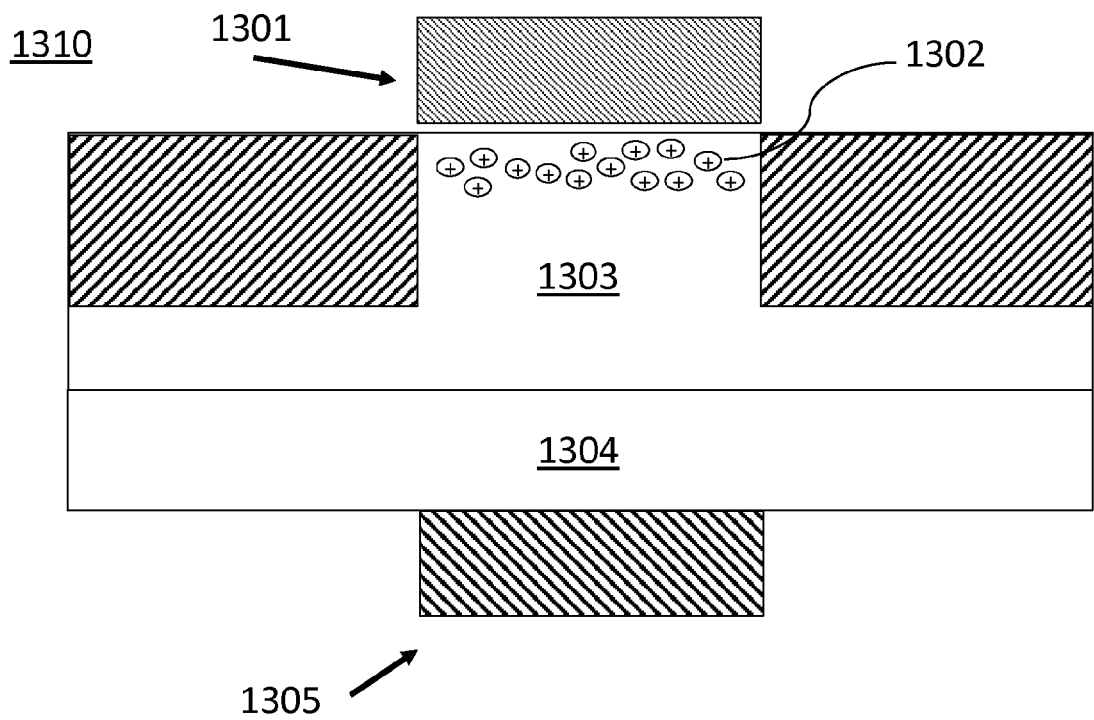

The effect of the second gate electrode below the buried oxide layer can be described with reference to cross sections 1300, 1310, and 1320 in FIGS. 13A-C. Cross section 1300 shows first gate electrode 1301 formed above body region 1303. The body region is above buried insulator 1304. Depending upon the conductivity type of the transistor, a positive or negative voltage applied to first gate electrode 1301 will create a channel 1302 in the body region 1303. The channel is formed when free majority-type carriers in body region 1303 are repelled by the voltage on the gate electrode to create an inversion region. If the voltage applied to the first electrode is of a relatively high magnitude, free minority-type carriers will accumulate in the channel region to form an accumulation region.

Cross section 1310 shows a similar cross section to 1300, with the exception of the addition of second gate electrode 1305. If the buried insulator is thick, the second gate electrode will not create a channel in the body of the device. Instead the second gate electrode will help to alleviate the body effect of the transistor. This effect is known to those of skill in the art, and can, among other things, deleteriously alter the threshold voltage and linearity of the transistor. Regardless, the second gate electrode must be formed in close enough proximity to the transistor channel to interact electrostatically with charge carriers in that region. The two gates can be biased at the same voltage using the same signal, or biased at the same voltage using two different signals, or can be biased at two different voltages.

Cross section 1320 illustrates a situation in which buried insulator 1304 is thin enough to serve as a gate insulator. In this situation, second gate electrode 1305 serves as a traditional gate electrode in that a standard control signal voltage applied to the electrode can result in the formation of a second channel 1306 in the body of the transistor 1303. The first gate electrode 1301 and second gate electrode 1305 are therefore spaced so that, when an on voltage is applied to the transistor, two separate channels develop in the body 1303 of the transistor. In this approach, the two gate electrodes can be biased in concert to control the combined channel of the transistor. In cross section 1320, the device is a fully depleted transistor in that the source and drain regions extend all the way down to the buried insulator layer. This kind of device is beneficially used in situations where the second gate electrode is meant to cause the creation of a second channel because the second gate electrode is therefore placed in close proximity to the regions of the source and drain between which a second channel should be formed.

Figure 11:
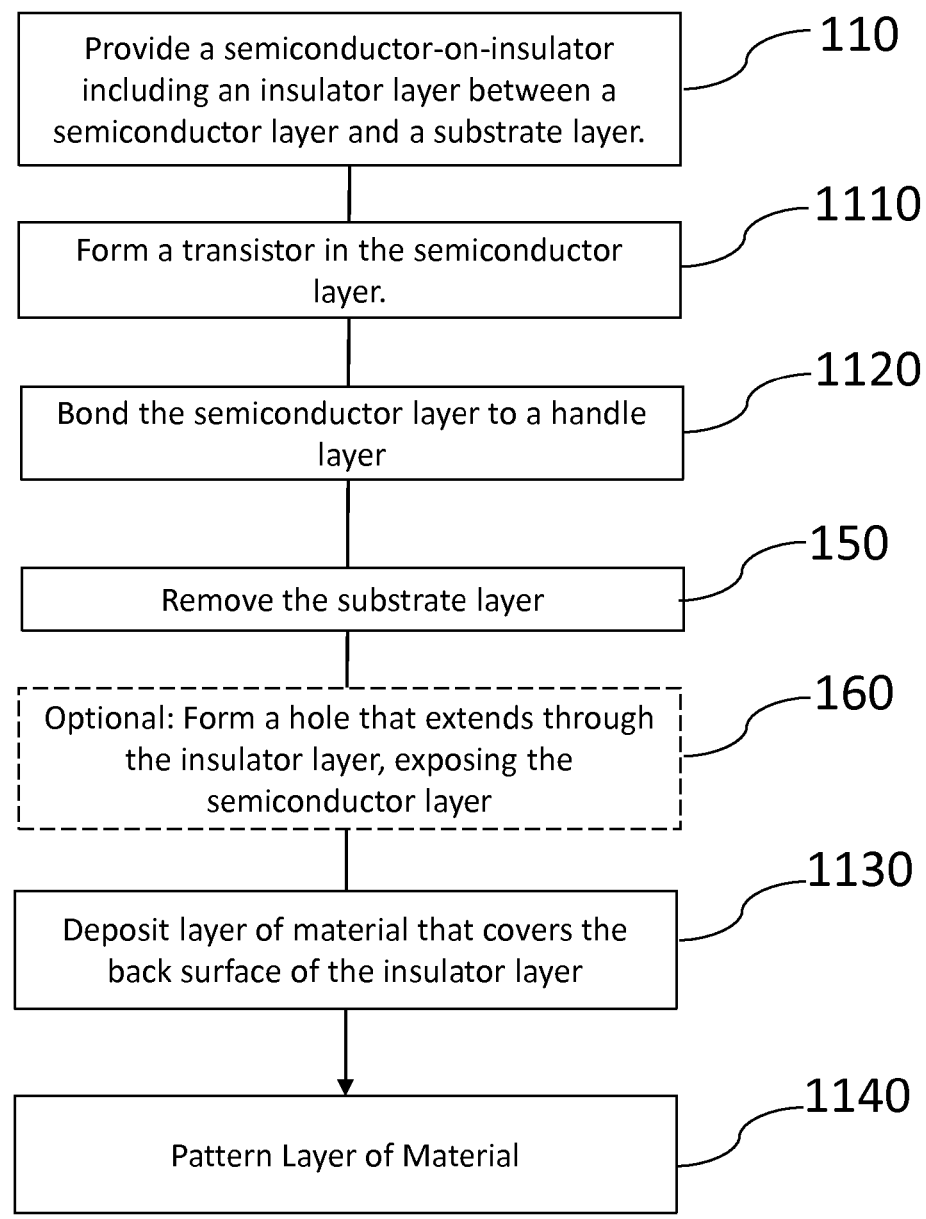
FIG. 11 shows a process flow chart of a method of fabricating an integrated circuit with gate electrodes on the back side of a buried insulator layer that are in accordance with a specific embodiment of the present invention.
Figure 14:
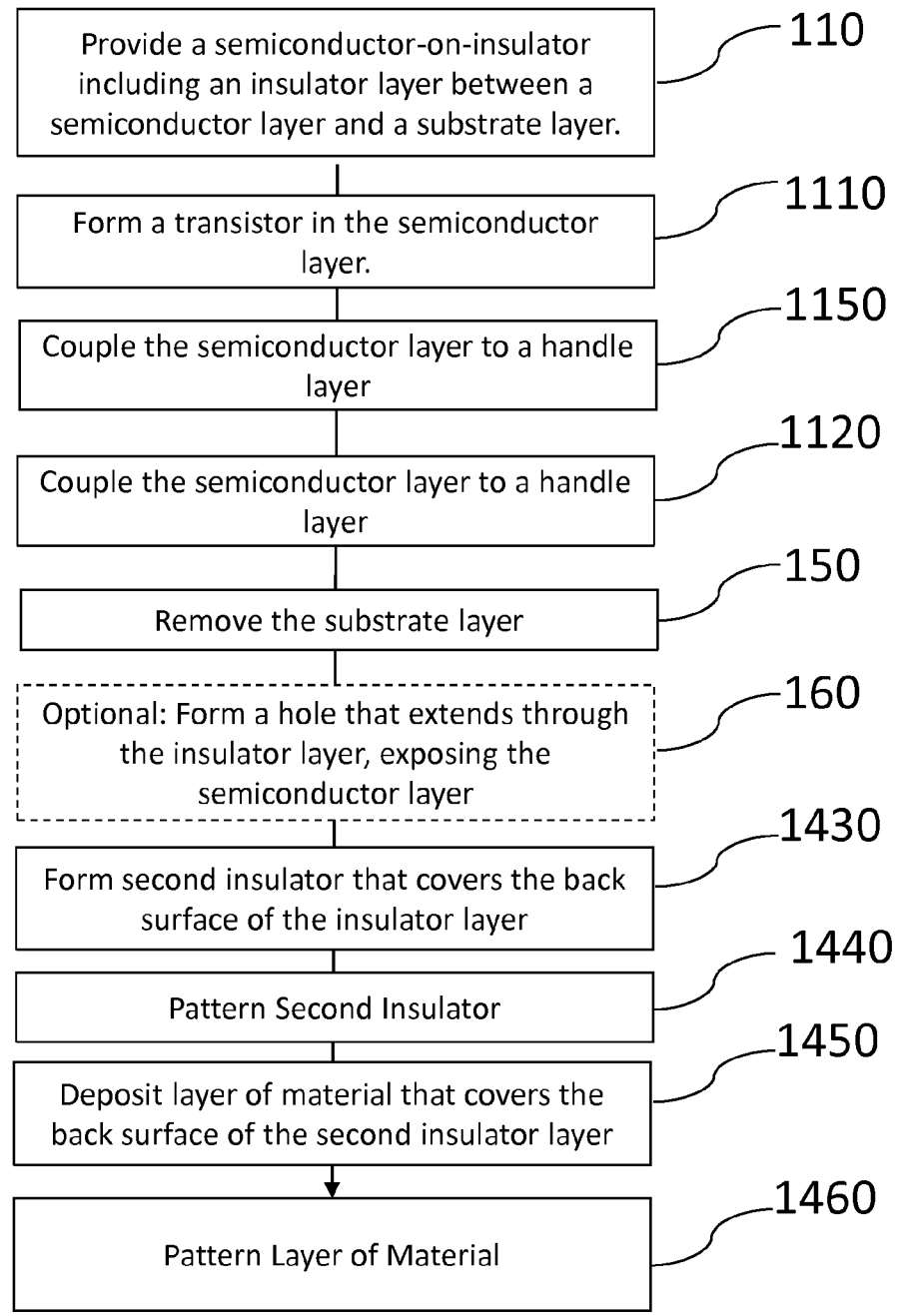
FIG. 14 shows a process flow chart of a method of fabricating an integrated circuit with gate electrodes on a second insulator layer on the back side of a buried insulator layer that are in accordance with a specific embodiment of the present invention.

FIG. 14 illustrates a method 1400 that is similar to method 1100 in FIG. 11 except for the addition of steps 1430, 1440, 1450, and 1460. In step 1430, after removing the substrate in step 150, a second insulator layer is formed on the back surface of the buried insulator layer. This step can be conducted via a deposition of insulating material and can alternatively or in combination involve an oxidation step if the insulator is an oxide. In step 1440, the second insulator layer is patterned. The pattern for the second insulator can align with the patterns formed in step 1140 of FIG. 11. In specific approaches, the patterning layer will expose the back surface of the buried insulator layer. In general, the pattern will at least partially align with the channels of transistors in the semiconductor layer. In step 1450, a layer of material is deposited that covers the second insulator layer and the exposed portion of the back surface of the buried insulator layer. The layer of material is conductive and can be any variant of the material described above with reference to step 1130. In step 1460, the deposited layer of material is patterned. The patterned layer of material will extend into the second insulator layer, cover the back side of the first insulator, and serve as the second gate electrode for devices formed in the semiconductor layer. In an alternative embodiment, step 1430 can be conducted after step 1460 such that the layer of material provides a pattern for the second insulator. This approach would be particularly amendable when step 1430 is an oxidation step. As with steps 1130 and 1140, steps 1450 and 1460 can be conducted simultaneous with the use of a mask such that the conductive material is formed in a pattern set by the mask, and steps 1450 and 1460 can also involve a blanket deposition of the material and a separate etching step to form the pattern.

Method 1400 provides a few advantages. As described above, the original buried insulator layer can initially be thin enough to serve as a gate insulator, and stresses should generally not be applied to a buried insulator layer in close proximity to the channel of devices formed in the semiconductor layer. However, patterning the insulator layer in close proximity to the channels of the transistors can provide more flexibility to the routing of the signals used to bias the second gate electrodes as explained below with reference to FIGS. 15A-C. Using two insulator layers therefore prevents the buried insulator from being exposed to stress while at the same time affording this flexibility.

Figure 15A:
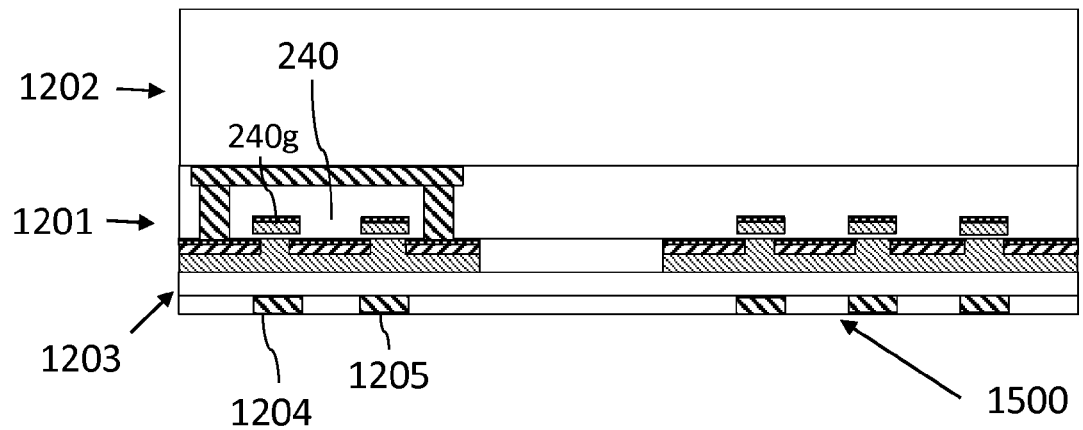
FIGS. 15A-C show cross-sections of semiconductor-on-insulator integrated circuits with gate electrodes on a second insulator layer formed on the back side of a buried insulator layer in accordance with specific embodiments of the present invention.

FIG. 15A illustrates handle wafer 1202 and SOI wafer 1201 with a second insulator layer 1500 formed on the back side of the semiconductor on insulator wafer 1201. Second insulator layer 1500 is in addition to buried insulator layer 1203. As drawn in FIG. 15A, second insulator layer 1500 has been patterned to provide trenches in which the conductive material is deposited to form strips of material such as strips 1204 and 1205 that are aligned under the gates of devices in the semiconductor layer. These strips of material can be connected to an external bias voltage. However, as illustrated in FIG. 15B they can also be connected to connecting strips of conductive material, such as strip 1501, that cover the back side of second insulator layer 1500.

Figure 15B:
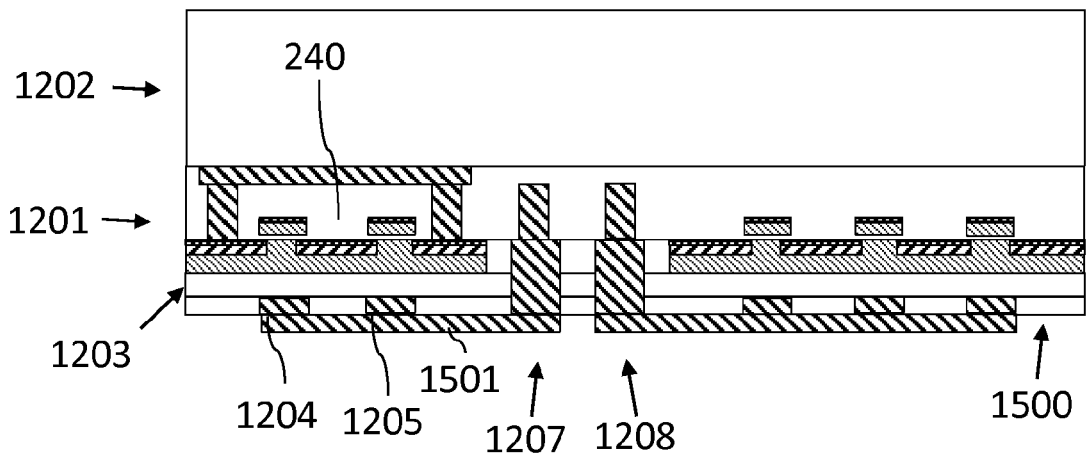
Figure 15:
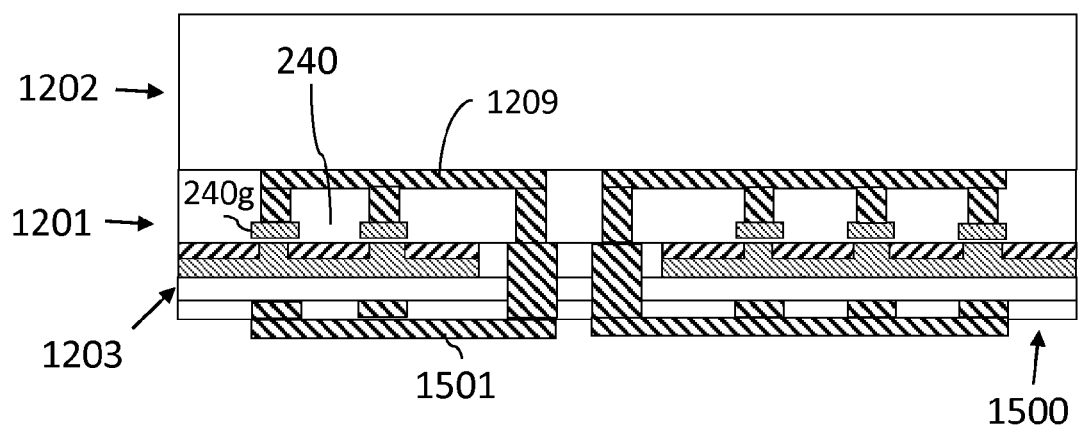

Strip 1501 in FIG. 15B is in the same plane as the source and drain of transistor 240. However, in contrast to FIG. 12B, second insulator layer 1500 is thick enough to prevent a signal on this line from deleteriously interfering with the performance of the transistor by electrostatically affecting the source and drain. This same configuration is problematic for an un-patterned buried insulator layer because the buried insulator would have to both be thin enough to allow the back side layer of material to electrostatically affect the body of the transistor while at the same time be thick enough to not electrostatically affect the source and drain of the device. The second insulator layer therefore provides a degree of flexibility to the routing of signals to the second gate electrodes. The second gate electrodes in FIGS. 15B-C can be biased in any manner that was described previously with reference to FIGS. 12B-C. For example, the second gate electrodes can be connected to an internal bias voltage or they can be connected to the first gate electrodes of their respective transistors as in FIG. 15C.

The processes described herein are applicable to many different types of SOI fabrication processes, for example, fully-depleted or partially-depleted SOI processes. Also, multiple layers of metal interconnect may be used on the front or back side of the transferred layer, by, for example, repeating the applicable steps described herein. Although the disclosure was focused on a transistor, for which a back side interconnect was required or a back side bias was applied, the device could have been and device such as a capacitor, inductor, thermistor, or any other type of active or passive device.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A method for manufacturing a semiconductor-on-insulator integrated circuit comprising:
   providing a semiconductor-on-insulator wafer having a first surface and a second surface, wherein the semiconductor-on-insulator wafer includes a semiconductor layer, a buried insulating layer, and a substrate layer, and wherein the substrate layer forms the second surface;
   forming a transistor in the semiconductor layer, wherein forming the transistor includes forming a first gate electrode of the transistor;
   bonding a handle wafer to the first surface of the semiconductor-on-insulator wafer;
   after bonding the handle wafer to the first surface, removing the substrate layer to expose a back surface of the buried insulator layer;
   forming a hole in the back surface of the buried insulator layer that extends through the buried insulator layer and exposes the semiconductor layer;
   depositing a layer of conductive material on the semiconductor-on-insulator wafer that extends into the hole in the buried insulator layer and covers the back surface of the buried insulator layer; and
   patterning the layer of conductive material to form a second gate electrode for the transistor on the back surface of the buried insulator layer;
   wherein the layer of conductive material provides an electrical connection to the semiconductor layer; and
   wherein the layer of conductive material provides an electrical connection to the gate electrode such that the second gate electrode and first gate electrode comprise a single circuit node in the semiconductor-on-insulator integrated circuit.

2. The method of claim 1, wherein:
   the layer of conductive material is a metal.

3. The method of claim 1, further comprising:
forming a contact for the layer of conductive material on the semiconductor layer;
wherein the hole extends through the semiconductor layer and exposes the contact; and
wherein the contact provides an electrical connection to a bias voltage.

4. The method of claim 1, wherein:
removing the substrate involves the use of a chemical etch; and
before the removing step, the buried insulator layer has a first thickness that is less than 400 nanometers.

5. The method of claim 4, wherein
after the removing step, the buried insulator has a second thickness that is less than 50 nanometers smaller than the first thickness.

6. The method of claim 5, wherein
the first gate electrode and second gate electrode are spaced so that, when an on voltage is applied to the transistor, two separate inversion layers develop in a body of the transistor.

7. A method for manufacturing a semiconductor-on-insulator integrated circuit comprising:
providing a semiconductor-on-insulator wafer having a first surface and a second surface, wherein the semiconductor-on-insulator wafer includes a semiconductor layer, a buried insulating layer, and a substrate layer, and wherein the substrate layer forms the second surface;
forming a transistor in the semiconductor layer, wherein forming the transistor includes forming a first gate electrode of the transistor;
removing the substrate layer to expose a back surface of the buried insulator layer;
forming a hole in the back surface of the buried insulator layer that extends through the buried insulator layer and exposes the semiconductor layer;
forming a layer of conductive material on the semiconductor-on-insulator wafer that extends into the hole in the buried insulator layer and covers the back surface of the buried insulator layer; and
patterning the layer of conductive material to form a second gate electrode for the transistor on the back surface of the buried insulator layer;
wherein the layer of conductive material provides an electrical connection to the gate electrode such that the second gate electrode and first gate electrode comprise a single circuit node in the semiconductor-on-insulator integrated circuit; and
wherein the layer of conductive material provides an electrical connection to the gate electrode such that the second gate electrode and first gate electrode comprise a single circuit node in the semiconductor-on-insulator integrated circuit.

8. The method of claim 7, further comprising:
bonding a handle wafer to the first surface of the semiconductor-on-insulator wafer;
wherein the removing step is conducted after the bonding step.

9. The method of claim 7, further comprising:
the layer of conductive material is a metal.

10. The method of claim 7, further comprising:
forming a contact for the layer of conductive material on the semiconductor layer;
wherein the hole extends through the semiconductor layer and exposes the contact; and
wherein the contact provides an electrical connection to a bias voltage.

11. The method of claim 7, further comprising:
removing the substrate involves the use of a chemical etch; and
before the removing step, the buried insulator layer has a first thickness that is less than 400 nanometers.

12. The method of claim 11, wherein:
after the removing step, the buried insulator has a second thickness that is less than 50 nanometers smaller than the first thickness.

13. The method of claim 12, wherein
the first gate electrode and second gate electrode are spaced so that, when an on voltage is applied to the first and second gate electrodes, two separate inversion layers develop in a body of the transistor.

14. A method for manufacturing a semiconductor-on-insulator integrated circuit comprising:
providing a semiconductor-on-insulator wafer having a first surface and a second surface, wherein the semiconductor-on-insulator wafer includes a semiconductor layer, a buried insulating layer, and a substrate layer, and wherein the substrate layer forms the second surface;
forming a transistor in the semiconductor layer, wherein forming the transistor includes forming a first gate electrode of the transistor;
bonding a handle wafer to the first surface of the semiconductor-on-insulator wafer;
after bonding the handle wafer to the first surface, removing the substrate layer to expose a back surface of the buried insulator layer;
after removing the substrate, forming a second insulator layer on the back surface of the buried insulator layer;
patterning the second insulator layer to expose the back surface of the buried insulator layer;
depositing a layer of conductive material on the semiconductor-on-insulator wafer that covers the second insulator layer and the exposed portion of the back surface of the buried insulator layer; and
patterning the layer of conductive material to form a second gate electrode for the transistor on the back surface of the buried insulator layer.

15. The method of claim 14, further comprising:
forming a hole in the back surface of the buried insulator layer that extends through the buried insulator layer and exposes the semiconductor layer;
wherein the layer of conductive material provides an electrical connection to the gate electrode such that the second gate electrode and first gate electrode comprise a single circuit node in the semiconductor-on-insulator integrated circuit.

16. The method of claim 14, wherein:
the layer of conductive material is a metal.

17. The method of claim 14, wherein:
before the removing step, the buried insulator layer has a first thickness that is less than 50 nanometers.

18. The method of claim 14, wherein:
the second gate electrode is coupled to an external contact.

19. The method of claim 14, wherein:
removing the substrate involves the use of a chemical etch; and
before the removing step, the buried insulator layer has a first thickness that is less than 400 nanometers.

20. The method of claim 19, wherein:
after the removing step, the buried insulator has a second thickness that is less than 50 nanometers smaller than the first thickness.

21. The method of claim 20, wherein:
the first gate electrode and second gate electrode are spaced so that, when an on voltage is applied to the first and second gate electrodes, two separate inversion layers develop in a body of the transistor.

\* \* \* \* \*